United States Patent
Nakano

(10) Patent No.: US 8,514,366 B2
(45) Date of Patent: Aug. 20, 2013

(54) EXPOSURE METHOD AND APPARATUS, MAINTENANCE METHOD AND DEVICE MANUFACTURING METHOD

(75) Inventor: Katsushi Nakano, Kumagaya (JP)

(73) Assignee: Nikon Corporation, Tokyo (JP)

( * ) Notice: Subject to any disclaimer, the term of this patent is extended or adjusted under 35 U.S.C. 154(b) by 795 days.

(21) Appl. No.: 12/289,148

(22) Filed: Oct. 21, 2008

(65) Prior Publication Data
US 2009/0066922 A1 Mar. 12, 2009

Related U.S. Application Data

(63) Continuation of application No. PCT/JP2007/060228, filed on May 18, 2007.

(30) Foreign Application Priority Data

May 18, 2006 (JP) .................................. 2006-139614
May 19, 2006 (JP) .................................. 2006-140957
Apr. 10, 2007 (JP) .................................. 2007-103343

(51) Int. Cl.
*G03B 27/52* (2006.01)
*G03B 27/42* (2006.01)
*G03B 27/32* (2006.01)
*G03F 7/20* (2006.01)

(52) U.S. Cl.
CPC .................................. *G03F 7/70925* (2013.01)
USPC .................................. 355/30; 355/53; 355/77

(58) Field of Classification Search
CPC .................................. G03F 7/70908; G03F 7/70925
USPC .................................. 355/30, 53, 72, 77
See application file for complete search history.

(56) References Cited

U.S. PATENT DOCUMENTS

| 4,465,368 A | 8/1984 | Matsuura et al. |
| 4,780,617 A | 10/1988 | Umatate et al. |

(Continued)

FOREIGN PATENT DOCUMENTS

| EP | 1 079 223 A1 | 2/2001 |
| EP | 1 420 298 A2 | 5/2004 |

(Continued)

OTHER PUBLICATIONS

English translation of PCT International Application PCT/JP2005/010412, published as WO 2005/122218 on Dec. 22, 2005.*

(Continued)

*Primary Examiner* — Steven H Whitesell Gordon
(74) *Attorney, Agent, or Firm* — Oliff & Berridge, PLC

(57) ABSTRACT

An exposure method includes holding a substrate held by a substrate holder on a substrate stage moving on an image plane side of a projection optical system; forming an immersion area the image plane side of the projection optical system by using a liquid supplied from a liquid supplying mechanism; and exposing a substrate by exposure light via the projection optical system and the immersion area. During a period when exposure of the substrate is not performed, an upper portion of the substrate holder is cleaned by moving the substrate stage relative to the immersion area, and an upper portion of a measuring stage is cleaned by moving the measuring stage relative to the immersion area. A cleaning liquid can be used as a liquid for forming the immersion area during cleaning. High-resolution immersion exposure is performed at a high throughput by suppressing entering of foreign materials into the liquid.

59 Claims, 15 Drawing Sheets

(56) References Cited

U.S. PATENT DOCUMENTS

| | | | |
|---|---|---|---|
| 5,243,195 A | 9/1993 | Nishi | |
| 5,559,582 A * | 9/1996 | Nishi et al. | 355/30 |
| 5,969,441 A | 10/1999 | Loopstra et al. | |
| 6,208,407 B1 | 3/2001 | Loopstra | |
| 6,341,007 B1 | 1/2002 | Nishi et al. | |
| 6,400,441 B1 | 6/2002 | Nishi et al. | |
| 6,549,269 B1 | 4/2003 | Nishi et al. | |
| 6,590,634 B1 | 7/2003 | Nishi et al. | |
| 6,611,316 B2 | 8/2003 | Sewell | |
| 6,778,257 B2 | 8/2004 | Bleeker et al. | |
| 6,897,963 B1 | 5/2005 | Taniguchi et al. | |
| 6,952,253 B2 | 10/2005 | Lof et al. | |
| 7,023,610 B2 | 4/2006 | Ohtsuki et al. | |
| 7,224,427 B2 | 5/2007 | Chang et al. | |
| 7,361,234 B2 * | 4/2008 | Hickman et al. | 134/21 |
| 7,466,392 B2 * | 12/2008 | Nagasaka et al. | 355/53 |
| 2002/0041377 A1 | 4/2002 | Hagiwara et al. | |
| 2002/0061469 A1 | 5/2002 | Tanaka | |
| 2005/0024609 A1 | 2/2005 | De Smit et al. | |
| 2005/0231694 A1 | 10/2005 | Kolesnychenko et al. | |
| 2005/0248856 A1 | 11/2005 | Omura et al. | |
| 2005/0259232 A1 | 11/2005 | Streefkerk et al. | |
| 2005/0280791 A1 | 12/2005 | Nagasaka et al. | |
| 2006/0007419 A1 | 1/2006 | Streefkerk et al. | |
| 2006/0028626 A1 | 2/2006 | Chang et al. | |
| 2006/0050351 A1 | 3/2006 | Higashiki | |
| 2006/0077367 A1 | 4/2006 | Kobayashi et al. | |
| 2006/0087630 A1 * | 4/2006 | Kemper et al. | 355/30 |
| 2006/0103818 A1 | 5/2006 | Holmes et al. | |
| 2006/0110689 A1 | 5/2006 | Chang | |
| 2006/0132731 A1 | 6/2006 | Jansen et al. | |
| 2006/0231206 A1 | 10/2006 | Nagasaka et al. | |
| 2006/0250588 A1 | 11/2006 | Brandl | |
| 2006/0256316 A1 | 11/2006 | Tanno et al. | |
| 2007/0039637 A1 | 2/2007 | Higashiki et al. | |
| 2007/0091287 A1 | 4/2007 | Chang et al. | |
| 2007/0127001 A1 | 6/2007 | Van Der Hoeven | |
| 2007/0252960 A1 | 11/2007 | Kida | |
| 2007/0285631 A1 | 12/2007 | Stavenga et al. | |
| 2008/0002162 A1 | 1/2008 | Jansen et al. | |
| 2008/0002163 A1 | 1/2008 | Fujiwara et al. | |
| 2008/0002164 A1 | 1/2008 | Chang et al. | |
| 2008/0018867 A1 | 1/2008 | Fujiwara et al. | |
| 2008/0117393 A1 | 5/2008 | Fujiwara et al. | |
| 2008/0252865 A1 | 10/2008 | Nagasaka et al. | |
| 2009/0225286 A1 * | 9/2009 | Nagasaka et al. | 355/30 |
| 2010/0134772 A1 | 6/2010 | Nagasaka et al. | |
| 2011/0116061 A1 | 5/2011 | Kolesnychenko et al. | |
| 2011/0281039 A1 | 11/2011 | Van Der Hoeven | |
| 2012/0013867 A1 | 1/2012 | Kolesnychenko et al. | |

FOREIGN PATENT DOCUMENTS

| | | |
|---|---|---|
| EP | 1 586 948 A1 | 10/2005 |
| EP | 1 713 113 A1 | 10/2006 |
| EP | 1 783 821 A1 | 5/2007 |
| EP | 1 783 822 A1 | 5/2007 |
| EP | 1 793 276 A2 | 6/2007 |
| EP | 1 811 546 A1 | 7/2007 |
| EP | 1 821 338 A1 | 8/2007 |
| JP | A-57-117238 | 7/1982 |
| JP | A-61-044429 | 3/1986 |
| JP | A-05-021314 | 1/1993 |
| JP | A-08-313842 | 11/1996 |
| JP | A-10-163099 | 6/1998 |
| JP | A-10-214783 | 8/1998 |
| JP | A-11-016816 | 1/1999 |
| JP | A-11-135400 | 5/1999 |
| JP | A-2000-505958 | 5/2000 |
| JP | A-2000-164504 | 6/2000 |
| JP | A-2001-510577 | 7/2001 |
| JP | A-2002-014005 | 1/2002 |
| JP | A-2004-519850 | 7/2004 |
| JP | A-2004-289126 | 10/2004 |
| JP | A-2004-304135 | 10/2004 |
| JP | A-2005-079222 | 3/2005 |
| JP | A-2005-277363 | 10/2005 |
| JP | A-2006-032750 | 2/2006 |
| JP | A-2006-073951 | 3/2006 |
| WO | WO 99/23692 A1 | 5/1999 |
| WO | WO 99/28790 A1 | 6/1999 |
| WO | WO 99/46835 A1 | 9/1999 |
| WO | WO 99/49504 A1 | 9/1999 |
| WO | WO 99/60361 A1 | 11/1999 |
| WO | WO 01/35168 A1 | 5/2001 |
| WO | WO 2004/019128 A2 | 3/2004 |
| WO | WO 2004/055803 A1 | 7/2004 |
| WO | WO 2004/057590 A1 | 7/2004 |
| WO | WO 2004/086468 A1 | 10/2004 |
| WO | WO 2004/093130 A2 | 10/2004 |
| WO | WO 2004/105107 A1 | 12/2004 |
| WO | WO 2005/029559 A1 | 3/2005 |
| WO | WO 2005/036623 A1 | 4/2005 |
| WO | WO 2005/059617 A2 | 6/2005 |
| WO | WO 2005/059618 A2 | 6/2005 |
| WO | WO 2005/074014 A1 | 8/2005 |
| WO | WO 2005/122218 | 12/2005 |
| WO | WO 2005/122218 A1 | 12/2005 |
| WO | WO 2005/124833 A1 | 12/2005 |
| WO | WO 2006/013806 A1 | 2/2006 |
| WO | WO 2006/038952 A2 | 4/2006 |
| WO | WO 2006/046562 A1 | 5/2006 |
| WO | WO 2006/049134 A1 | 5/2006 |
| WO | WO 2006/062188 A1 | 6/2006 |
| WO | WO 2006/122578 A1 | 11/2006 |

OTHER PUBLICATIONS

Jun. 26, 2007 International Search Report issued for the International Application No. PCT/JP2007/060228 (with Translation).
Jun. 26, 2007 Written Opinion issued for the International Application No. PCT/JP2007/060228 (with Translation).
Chinese Office Action issued in corresponding Chinese Patent Application No. 2007800110334, issued Dec. 11, 2009 (with English-language translation).
Written Opinion for corresponding Singaporean Patent Application No. 200808132-5, mailed on Jul. 12, 2010.
Jul. 22, 2011 Examination Report issued in Singapore Application No. 200808132-5.
Mar. 13, 2012 Office Action issued in JP Application No. 2007-132800 (with English translation).
Dec. 8, 2011 extended European Search Report issued in EP Application No. 07743663.2.

* cited by examiner

EXPOSURE METHOD AND APPARATUS, MAINTENANCE METHOD AND DEVICE MANUFACTURING METHOD

CROSS-REFERENCE

This application is a Continuation Application of International Application No. PCT/JP2007/060228 which was filed on May 18, 2007 claiming the conventional priority of Japanese patent Applications No. 2006-139614 filed on May 18, 2006, No. 2006-140957 filed on May 19, 2006 and No. 2007-103343 filed on Apr. 10, 2007.

BACKGROUND OF THE INVENTION

1. Field of the Invention

The present invention relates to an exposure technique for exposing a substrate with an exposure light beam through a liquid, a maintenance technique for an exposure apparatus using the exposure technique, and a technique for producing a device using the exposure technique.

2. Description of the Related Art

A microdevice (electronic device), which includes a semiconductor device, a liquid crystal display device, etc. is produced by the so-called photolithography technique wherein a pattern, which is formed on a mask such as a reticle, is transferred onto a substrate such as a wafer which is coated with a resist (photosensitive material). In order to transfer the pattern on the mask onto the substrate via a projection optical system in the photolithography step, those used are an exposure apparatus (so-called stepper) of the reduction projection type based on the step-and-repeat system and an exposure apparatus (so-called scanning stepper) of the reduction projection type based on the step-and-scan system.

As for the exposure apparatus of this type, it has been carried out to shorten the wavelength of the exposure light and increase the numerical aperture (NA) of the projection optical system (realize the large NA) in order to respond to such a request that the higher resolution (resolving power) is demanded year by year as the pattern becomes fine and minute accompanying with the realization of the high integration of the semiconductor device or the like. However, when the wavelength of the exposure light is shortened and NA is increased, then the resolution of the projection optical system is improved, while the depth of focus is consequently decreased and narrowed. Therefore, if such a situation is continued, then the depth of focus is too narrowed and it is feared that the focus margin may be insufficient during the exposure operation.

In view of the above, an exposure apparatus, which utilizes the liquid immersion method, has been developed. The liquid immersion method is such a method that the exposure wavelength is substantially shortened and the depth of focus is widened as compared with those obtained in the air (see, for example, International Publication No. 99/49504). In the liquid immersion method, the exposure is performed in such a state that the liquid immersion area is formed by filling a space between the lower surface of the projection optical system and a surface of the substrate with a liquid including water, organic solvents, etc. By doing so, the resolution can be improved and the depth of focus can be magnified about n times by utilizing the fact that the wavelength of the exposure light is 1/n-fold in the liquid as compared with the wavelength in the air (n represents the refractive index of the liquid, which is, for example, about 1.2 to 1.6).

SUMMARY OF THE INVENTION

When the exposure process is performed by using the liquid immersion method as described above, if any minute foreign matter is adhered on a substrate stage which is movable while holding the substrate as the exposure objective, then it is feared that the foreign matter may be entered into and mixed with the liquid during the movement on the substrate stage with respect to the liquid immersion area. If the foreign matter, which is entered into and mixed with the liquid as described above, adheres onto the substrate, it is feared that any defect such as the shape deficiency or unsatisfactory shape may arise in the pattern to be transferred.

Taking the foregoing circumstances into consideration, a first object of the present invention is to provide an exposure technique, a maintenance technique, and a device-producing technique which make it possible to decrease the amount of the foreign matter that enters into and mixes with the liquid when the exposure is performed by the liquid immersion method. A second object of the present invention is to provide an exposure technique, a maintenance technique, and a device-producing technique which make it possible to efficiently remove the foreign matter adhered to a member (for example, the substrate stage, etc.) with which the liquid makes contact.

According to a first aspect of the present invention, there is provided an exposure method for exposing a substrate, the exposure method comprising: forming a liquid immersion area on the substrate held by a substrate stage to expose the substrate with an exposure light through a liquid of the liquid-immersion area; and cleaning the substrate stage by moving the substrate stage relative to the liquid immersion area during a period in which the substrate is not exposed.

According to a second aspect of the present invention, there is provided an exposure method for exposing a substrate with an exposure light via an optical member and a liquid, the exposure method comprising: arranging a movable member, which makes contact with the liquid, to be opposite to or face the optical member; and moving the movable member relative to a liquid immersion area of a cleaning liquid formed between the optical member and the movable member to clean the movable member.

According to a third aspect of the present invention, there is provided an exposure apparatus which exposes a substrate with an exposure light through a liquid, the exposure apparatus comprising: a substrate stage which holds the substrate; a liquid immersion mechanism which supplies the liquid onto the substrate to form a liquid immersion area; and a controller which moves the substrate stage relative to the liquid immersion area to clean the substrate stage during a period in which the substrate is not exposed.

According to a fourth aspect of the present invention, there is provided an exposure apparatus which exposes a substrate with an exposure light via an optical member and a liquid, the exposure apparatus comprising: a movable member which is arranged to be opposite to the optical member and which makes contact with the liquid; a liquid immersion mechanism which forms a liquid immersion area of a cleaning liquid between the optical member and the movable member; and a controller which moves the movable member relative to the liquid immersion area to clean the movable member.

According to a fifth aspect of the present invention, there is provided a maintenance method for an exposure apparatus which forms a liquid immersion area on a substrate held by a substrate stage and which exposes the substrate with an exposure light through a liquid of the liquid immersion area, the maintenance method comprising: arranging the substrate stage to be opposite to a liquid immersion member which performs at least one of supply and recovery of the liquid with respect to the liquid immersion area; and moving the substrate stage relative to the liquid immersion area to clean at least one of the liquid immersion member and the substrate stage during a period in which the substrate is not exposed.

According to a sixth aspect of the present invention, there is provided a maintenance method for an exposure apparatus which exposes a substrate with an exposure light via an optical member and a liquid, the maintenance method comprising: arranging a movable member, which makes contact with the liquid, to be opposite to the optical member; and moving the movable member relative to a liquid immersion area of a cleaning liquid formed between the optical member and the movable member to clean the movable member.

According to a seventh aspect of the present invention, there is provided an exposure method for exposing a substrate, the exposure method comprising: filling, with a liquid, an optical path space for an exposure light on the substrate held by a substrate stage; exposing the substrate with the exposure light through the liquid; and supplying an ultrasonically vibrated cleaning liquid onto the substrate stage during a period in which the substrate is not exposed.

According to an eighth aspect of the present invention, there is provided an exposure method for exposing a substrate, the exposure method comprising: filling an optical path space for an exposure light with a liquid by a liquid immersion mechanism on the substrate held by a substrate stage; exposing the substrate with the exposure light through the liquid; and supplying a cleaning liquid to at least one of a supply port and a recovery port, for the liquid, of the liquid immersion mechanism during a period in which the substrate is not exposed.

According to a ninth aspect of the present invention, there is provided an exposure method for exposing a plurality of areas on a substrate with an exposure light through a liquid, the exposure method comprising: exposing the plurality of areas respectively through the liquid while moving a movable member which holds the substrate along a first route; and cleaning the movable member with the liquid or a cleaning liquid by moving the movable member holding a dummy substrate along a second route different from the first route.

According to a tenth aspect of the present invention, there is provided an exposure apparatus which exposes a substrate, the exposure apparatus comprising: a liquid immersion mechanism which fills an optical path space for an exposure light with a liquid on the substrate held by a substrate stage; an ultrasonic vibrator which is provided in the vicinity of a supply port, for the liquid, of the liquid immersion mechanism; and a controller which controls the ultrasonic vibrator so that a cleaning liquid, which is vibrated by an ultrasonic wave generated by the ultrasonic vibrator, is supplied onto the substrate stage during a period in which the substrate is not exposed.

According to an eleventh aspect of the present invention, there is provided an exposure apparatus which exposes a substrate, the exposure apparatus comprising: a liquid immersion mechanism including a first liquid supply mechanism which supplies a liquid to an optical path space for an exposure light on the substrate held by a substrate stage; a second liquid supply mechanism which is provided on a side of the substrate stage and which supplies a cleaning liquid; an ultrasonic vibrator which vibrates the cleaning liquid by an ultrasonic wave; and a controller which controls the ultrasonic vibrator so that the cleaning liquid, vibrated by the ultrasonic wave generated by the ultrasonic vibrator, is supplied to at least one of a supply port and a recovery port for the liquid of the liquid immersion mechanism during a period in which the substrate is not exposed.

According to a twelfth aspect of the present invention, there is provided an exposure apparatus which exposes a substrate through a liquid, the exposure apparatus comprising: a liquid immersion mechanism which fills an optical path space for an exposure light with the liquid on the substrate held by a substrate stage; and a device which supplies a cleaning liquid to at least one of a supply port and a recovery port for the liquid of the liquid immersion mechanism during a period in which the substrate is not exposed.

According to a thirteenth aspect of the present invention, there is provided an exposure apparatus which exposes a substrate with an exposure light via an optical member and a liquid, the exposure apparatus comprising: a movable member which is arranged to be opposite to the optical member; and a cleaning device which includes a vibrator provided on the movable member and which cleans a member, making contact with the liquid, with a cleaning liquid vibrated by the vibrator.

According to a fourteenth aspect of the present invention, there is provided a method for producing a device, comprising: exposing a substrate by using the exposure method or the exposure apparatus of the present invention; developing the exposed substrate; and processing the developed substrate.

According to the present invention, any foreign matter, which is adhered to the substrate stage and/or the liquid immersion member, can be removed, for example, by moving the substrate stage with respect to the liquid immersion area. Therefore, afterwards, when the substrate is exposed by the liquid immersion method, then the amount of the foreign matter entered into and mixed with the liquid is decreased, and it is possible to perform the exposure highly accurately.

BEST MODE FOR CARRYING OUT THE INVENTION

First Embodiment

A preferred embodiment of the present invention will be explained below with reference to the drawings.

Figure 1:
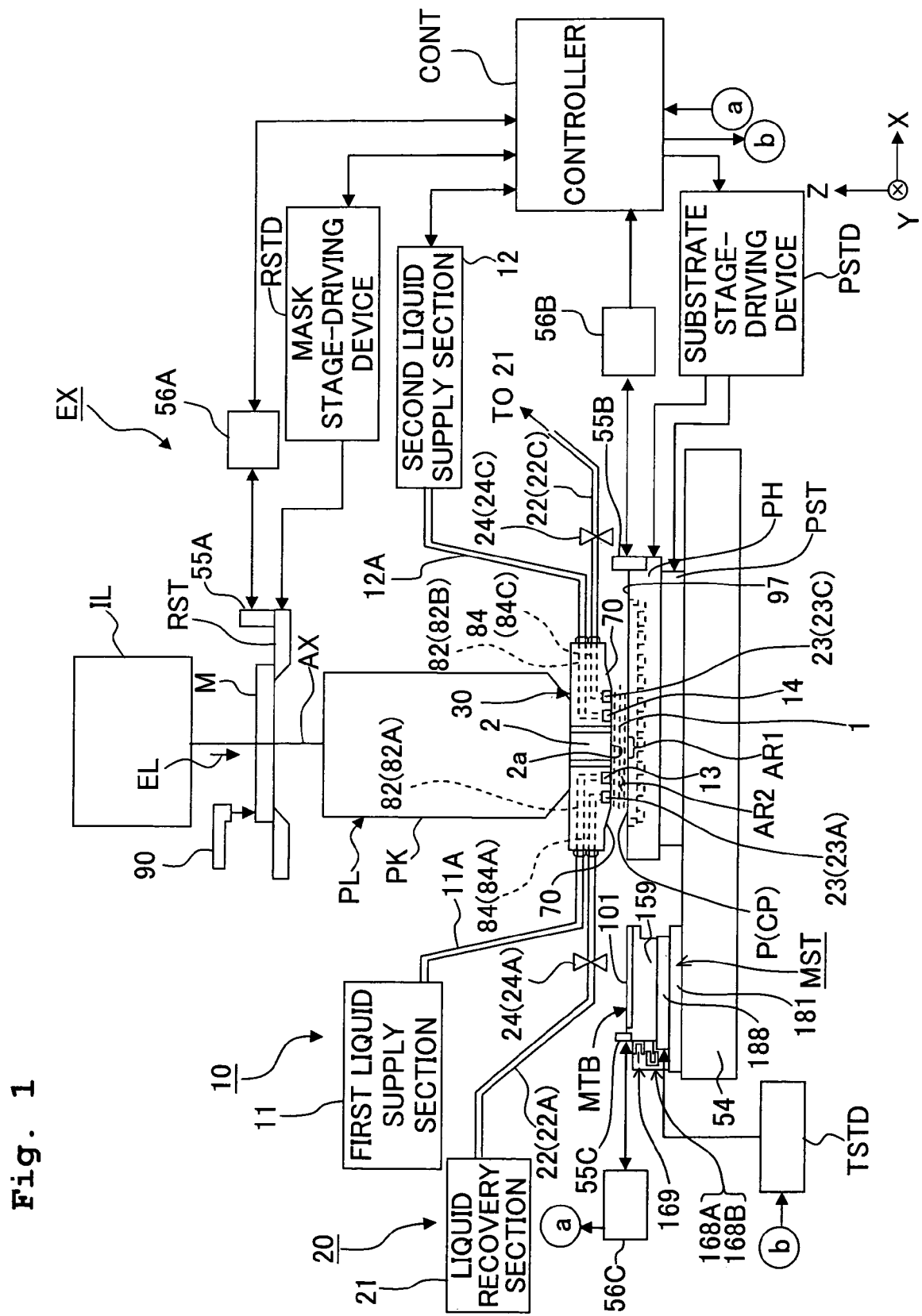
FIG. 1 shows a schematic construction of an exemplary embodiment of an exposure apparatus of the present invention.

FIG. 1 shows a schematic construction of an exposure apparatus EX according to the first embodiment of the present invention. With reference to FIG. 1, the exposure apparatus EX includes a mask stage RST which supports a mask M formed with a transferring pattern (pattern to be transferred); a substrate stage PST which supports a substrate P as an exposure objective; an illumination optical system IL which illuminates, with an exposure light EL, the mask M supported by the mask stage RST; a projection optical system PL which projects an image of the pattern (pattern image) of the mask M, illuminated with the exposure light EL, onto a projection area AR1 on the substrate P supported by the substrate stage PST; a measuring stage MST which is formed with a reference mark for the alignment, etc.; a controller CONT which integrally controls the operation of the entire exposure apparatus EX; and a liquid immersion mechanism which is provided for the application of the liquid immersion method. The liquid immersion mechanism of this embodiment includes a liquid supply mechanism 10 which supplies the liquid 1 onto the substrate P and onto the measuring stage MST, and a liquid recovery mechanism 20 which recovers the liquid 1 supplied onto the substrate P and onto the measuring stage MST.

The exposure apparatus EX forms the liquid immersion area AR2 (locally) in a partial area on the substrate P including the projection area AR1 of the projection optical system PL or in the partial area on the substrate P and a surrounding area around the partial area, with the liquid 1 supplied from the liquid supply mechanism 10 at least during the period in which the pattern image of the mask M is transferred onto the substrate P. Specifically, the exposure apparatus EX adopts the local liquid immersion system in which the liquid 1 fills a space between the optical element (for example, a lens having a substantially flat bottom surface or a plane-parallel) 2 at the terminal end (end portion) on the image plane side of the projection optical system PL and a surface of the substrate P arranged on the image plane side; and in which the substrate P is exposed with the exposure light EL passing through the mask M, via the projection optical system PL and the liquid 1 between the projection optical system PL and the substrate P, so that the pattern of the mask M is transferred to and exposed on the substrate P.

This embodiment is illustrative of an exemplary case in which the scanning type exposure apparatus (so-called scanning stepper) is used as the exposure apparatus EX which exposes the substrate P with the pattern formed on the mask M while synchronously moving the mask M and the substrate P in a predetermined scanning direction. The following description will be made assuming that the Z axis extends in parallel to the optical axis AX of the projection optical system PL, the X axis extends in the synchronous movement direction (scanning direction) of the mask M and the substrate P in a plane perpendicular to the Z axis, and Y axis extends in the direction (non-scanning direction) perpendicular to the scanning direction. The directions of rotation (inclination) about the X axis, the Y axis, and the Z axis are designated as the $\theta X$, $\theta Y$, and $\theta Z$ directions respectively. In this description, the term "substrate" includes those obtained by coating, on a base material including for example a semiconductor wafer such as a silicon wafer, a photosensitive material (hereinafter appropriately referred to as "resist"), and also includes those obtained by coating the base material with various films including a protective film (top coat film), etc. distinctly from the photosensitive film. The mask includes a reticle on which a device pattern to be subjected to the reduction projection onto the substrate is formed. For example, the mask is obtained such that a predetermined pattern is formed by using a light-shielding film such as chromium on a transparent plate member such as a glass plate. The transmission type mask is not limited to a binary mask in which the pattern is formed with the light-shielding film, and also includes, for example, a phase shift mask of the spatial frequency modulation type, etc. or the half tone type. The substrate P of this embodiment is obtained, for example, such that a disk-shaped semiconductor wafer, which has a diameter of about 200 mm to 300 mm, is coated with a resist (photoresist) as the photosensitive material to provide a predetermined thickness (for example, about 200 nm).

At first, the illumination optical system IL illuminates, with the exposure light EL, the mask M supported by the mask stage RST. The illumination optical system IL includes an optical integrator which uniformizes the illuminance of the light flux radiated from an unillustrated exposure light source, a condenser lens which collects the exposure light EL from the optical integrator, a relay lens system, a variable field diaphragm which defines the illumination area on the mask M brought about by the exposure light EL to have a slit-shaped form, and the like. A predetermined illumination area on the mask M is illuminated with the exposure light EL having the uniform illuminance distribution by the illumination optical system IL. Those used as the exposure light EL radiated from the illumination optical system IL include, for example, emission lines (i-ray, etc.) in the ultraviolet region radiated, for example, from a mercury lamp; far ultraviolet light beams (DUV light beams) such as the KrF excimer laser beam (wavelength: 248 nm); and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used as the exposure light EL.

The mask stage RST supports the mask M. The mask stage RST is two-dimensionally movable in the plane perpendicular to the optical axis AX of the projection optical system PL on an unillustrated mask base, i.e., in the XY plane, and it is finely rotatable in the $\theta Z$ direction. The mask stage RST is driven, for example, by a mask stage-driving device RSTD such as a linear motor. The mask stage-driving device RSTD is controlled by the controller CONT. A reflecting mirror 55A is provided on the mask stage RST. A laser interferometer 56A is provided at a position opposite to or facing the reflecting mirror 55A. In reality, the laser interferometer 56A constitutes a laser interferometer system having three or more length-measuring axes. The position in the two-dimensional direction and the angle of rotation of the mask stage RST (mask M) are measured in real-time by the laser interferometer 56A. An obtained result of the measurement is outputted to the controller CONT. The controller CONT drives the mask stage-driving device RSTD based on the result of the measurement to thereby move or position the mask M supported by the mask stage RST. The reflecting mirror 55A is not limited only to the plane mirror, and may include a corner cube (retroreflector). Alternatively, for example, it is also allowable to use a reflecting surface formed by mirror-finishing an end surface (side surface) of the mask stage RST, instead of the reflecting mirror 55A.

The projection optical system PL projects the pattern of the mask M onto the substrate P to perform the exposure at a predetermined projection magnification β (β represents the reduction magnification, which is, for example, ¼, ⅕ or the like). The projection optical system PL is constructed by a plurality of optical elements including an optical element 2 which is provided at a terminal end (end portion) on the side of the substrate P (image plane side of the projection optical system PL). The optical elements are supported by a barrel PK. The projection optical system PL is not limited to the reduction system, and may be any one of the 1× magnification system and the magnifying system. The optical element 2, which is disposed at the end portion of the projection optical system PL, is provided detachably (exchangeably) with respect to the barrel PK. The liquid 1 of the liquid immersion area AR2 makes contact with the optical element 2. Although not shown, the projection optical system PL is provided on a barrel surface plate supported by three support columns via an anti-vibration mechanism. However, as disclosed, for example, in International Publication No. 2006/038952, the projection optical system PL may be supported in a hanging manner on an unillustrated main frame member etc. which is arranged over or above the projection optical system PL or on a base member on which the mask stage RST is arranged.

In this embodiment, pure or purified water is used as the liquid 1. Not only the ArF excimer laser beam but also the far ultraviolet light beam (DUV light beam) such as the KrF excimer laser beam and the emission line radiated, for example, a mercury lamp is also transmissive through pure water. The optical element 2 is formed of calcium fluoride ($CaF_2$). Calcium fluoride has a high affinity for water. Therefore, it is possible to allow the liquid 1 to make tight contact with the substantially entire surface of a liquid contact surface 2a of the optical element 2. The optical element 2 may be silica glass which has high affinity for water.

The resist of the substrate P is, for example, a liquid-repellent resist which repels the liquid 1. As described above, the resist may be coated with the top coat for the protection, if necessary. In this embodiment, the property to repel the liquid 1 is called "liquid repellence". When the liquid 1 is pure water, the liquid repellence means the water repellence.

A substrate holder PH, which holds the substrate P, for example, by the vacuum attraction, is fixed to the upper portion of the substrate stage PST. The substrate stage PST is provided with a Z stage portion which controls the position in the Z direction (focus position) and the angles of inclination in the θX and θY directions of the substrate holder PH (substrate P), and an XY stage portion which is movable while supporting the Z stage portion. The XY stage portion is placed over a guide surface (surface substantially parallel to the image plane of the projection optical system PL) which is parallel to the XY plane on the base 54, for example, with an air bearing (gas bearing) intervening therebetween. The substrate stage PST (Z stage portion and XY stage portion) is driven by a substrate stage-driving device PSTD such as a linear motor. The substrate stage-driving device PSTD is controlled by the controller CONT. In this embodiment, the substrate holder is formed on a table which is movable in the Z, θX, and θY directions, and these components are collectively referred to as "substrate holder PH". The table and the substrate holder may be constructed separately or distinctly, and the substrate holder may be fixed to the table, by the vacuum attraction, etc. The Z stage portion may include only an actuator which drives the substrate holder PH (table) in the Z, θX, and θY directions.

Figure 8A:
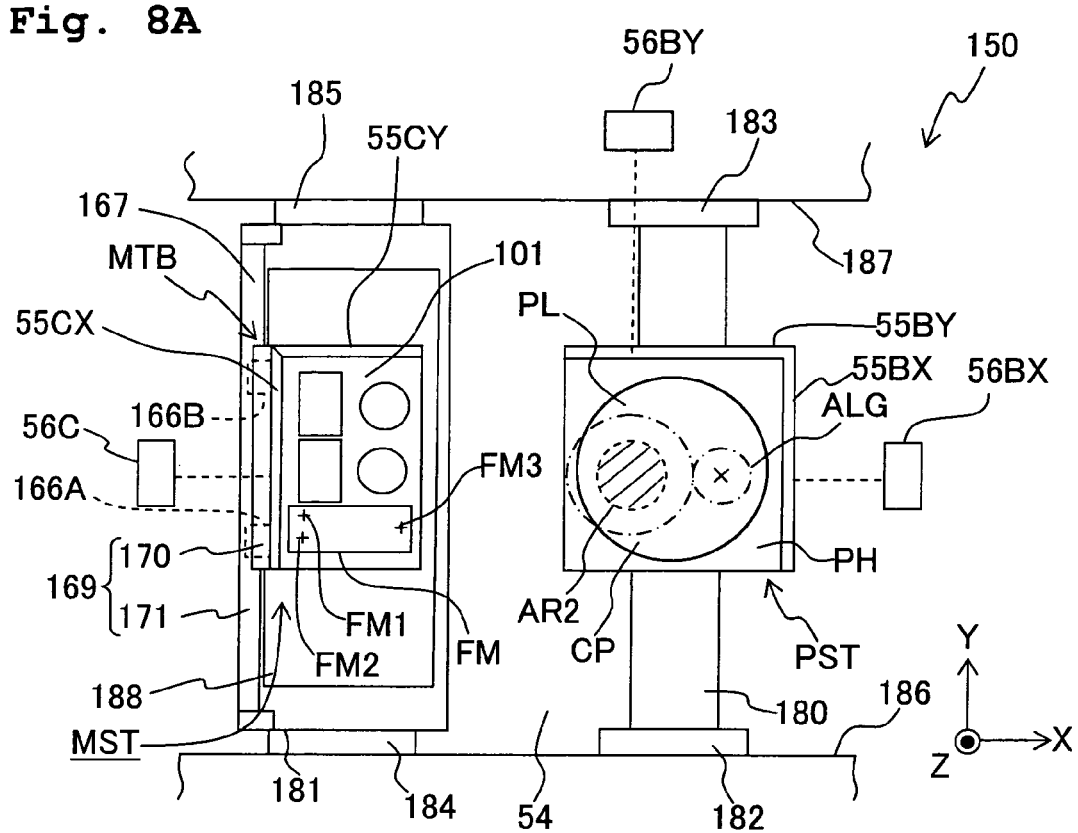
FIG. 8A is a plan view of the substrate stage PST and a measuring stage MST shown in FIG. 1.

A reflecting mirror 55B is provided on the substrate holder PH on the substrate stage PST. A laser interferometer 56B is provided at a position opposite to or facing the reflecting mirror 55B. In reality, as shown in FIG. 8A, the reflecting mirror 55B is constructed of an X axis reflecting mirror 55BX and a Y axis reflecting mirror 55BY; and the laser interferometer 56B is also constructed of an X axis laser interferometer 56BX and a Y axis laser interferometer 56BY. With reference to FIG. 1 again, the position in the two-dimensional direction and the angle of rotation of the substrate holder PH (substrate P) on the substrate stage PST are measured in real-time by the laser interferometer 56B. An obtained result of the measurement is outputted to the controller CONT. The controller CONT drives the substrate stage-driving device PSTD based on the result of the measurement to thereby move or position the substrate P supported by the substrate stage PST. The laser interferometer 56B may be also capable of measuring the information about the position in the Z axis direction and the rotation in the θX and θY directions of the substrate stage PST, details of which are disclosed, for example, in Published Japanese Translation of PCT International Publication for Patent Application No. 2001-510577 (corresponding to International Publication No. 1999/28790). A reflecting surface, which is formed by mirror-finishing a side surface etc. of the substrate stage PST or the substrate holder PH, may be used instead of the reflecting mirror 55B.

A plate portion 97 which is flat and annular is provided on the substrate holder PH to surround the substrate P with the plate portion 97. The upper surface of the plate portion 97 is a flat surface which has an approximately same height as that of a surface of the substrate P held by the substrate holder PH. In this embodiment, the flat surface is liquid-repellent. In this construction, a gap of about 0.1 to 1 mm is provided between the edge of the substrate P and the plate portion 97. However, in this embodiment, the resist of the substrate P is liquid-repellent, and the liquid 1 has the surface tension. Therefore, the liquid 1 hardly inflows into the gap. Even when a portion in the vicinity of the circumferential edge of the substrate P is exposed, it is possible to retain the liquid 1 between the plate portion 97 and the projection optical system PL. In this embodiment, the liquid 1, which inflows into the gap between the plate portion 97 and the substrate P, can be discharged to the outside of the substrate holder PH by a sucking device 50 shown in FIG. 5 (details will be described later on). Therefore, it is not necessarily indispensable that the resist (or the top coat) of the substrate P is liquid-repellent. In this embodiment, the plate portion 97 is provided for the substrate holder PH. However, the upper surface of the substrate holder PH, which surrounds the substrate P, may be subjected to the liquid-repelling process to form the flat surface.

Description of Liquid Supply and Recovery Mechanisms

Next, the liquid supply mechanism 10 shown in FIG. 1 is provided to supply a certain or predetermined liquid 1 onto the substrate P. The liquid supply mechanism 10 includes a first liquid supply section 11 and a second liquid supply section 12 which are capable of feeding the liquid 1, and first and second supply tubes 11A, 12A each of which has one end connected to one of the first and second liquid supply sections 11, 12. Each of the first and second liquid supply sections 11, 12 is provided with a tank for accommodating the liquid 1, a filter section, a pressurizing pump, and the like. It is not necessarily indispensable that the liquid supply mechanism 10 is provided with all of the tank, the filter section, the pressurizing pump, etc.; and at least a part or parts thereof may be substituted, for example, with any equipment of the factory or the like in which the exposure apparatus EX is installed.

The liquid recovery mechanism 20 is provided to recover the liquid 1 supplied onto the substrate P. The liquid recovery mechanism 20 includes a liquid recovery section 21 which is capable of recovering the liquid 1, and a recovery tube 22 (constructed of first to fourth recovery tubes 22A, 22B, 22C, 22D shown in FIG. 2) which has one end connected to the liquid recovery section 21. A valve 24 (constructed of first to fourth valves 24A, 24B, 24C, 24D shown in FIG. 2) is provided at an intermediate position of the recovery tube 22 (22A to 22D). The liquid recovery section 21 is provided with a vacuum system (sucking device) such as a vacuum pump, a tank for accommodating the recovered liquid 1, etc. It is not necessarily indispensable that the liquid recovery mechanism 20 is provided with all of the vacuum system, the tank, etc., and at least a part or parts thereof may be substituted with any equipment of the factory or the like in which the exposure apparatus EX is installed.

A flow passage-forming member (liquid immersion member) 30 is arranged in the vicinity of the optical element 2 at the terminal end or end portion of the projection optical system PL. The flow passage-forming member 30 is an annular member which is provided to surround the circumference of the optical element 2 over or above the substrate P (substrate stage PST). The flow passage-forming member 30 is provided with a first supply port 13 and a second supply port 14 (see FIG. 3) which are arranged to be opposite to or face the surface of the substrate P in a state that the projection area AR1 of the projection optical system PL is disposed on the substrate P. The flow passage-forming member 30 has a supply flow passage 82 (82A, 82B) formed inside thereof. One end of the supply flow passage 82A is connected to the first supply port 13, and the other end of the supply flow passage 82A is connected to the first liquid supply section 11 via the first supply tube 11A. One end of the supply flow passage 82B is connected to the second supply port 14, and the other end of the supply flow passage 82B is connected to the second liquid supply section 12 via the second supply tube 12A. Further, the flow passage-forming member 30 is provided with four recovery ports 23A to 23D (see FIG. 3) which are provided over or above the substrate P (substrate stage PST) and which are arranged to be opposite to or face the surface of the substrate P.

Figure 2:
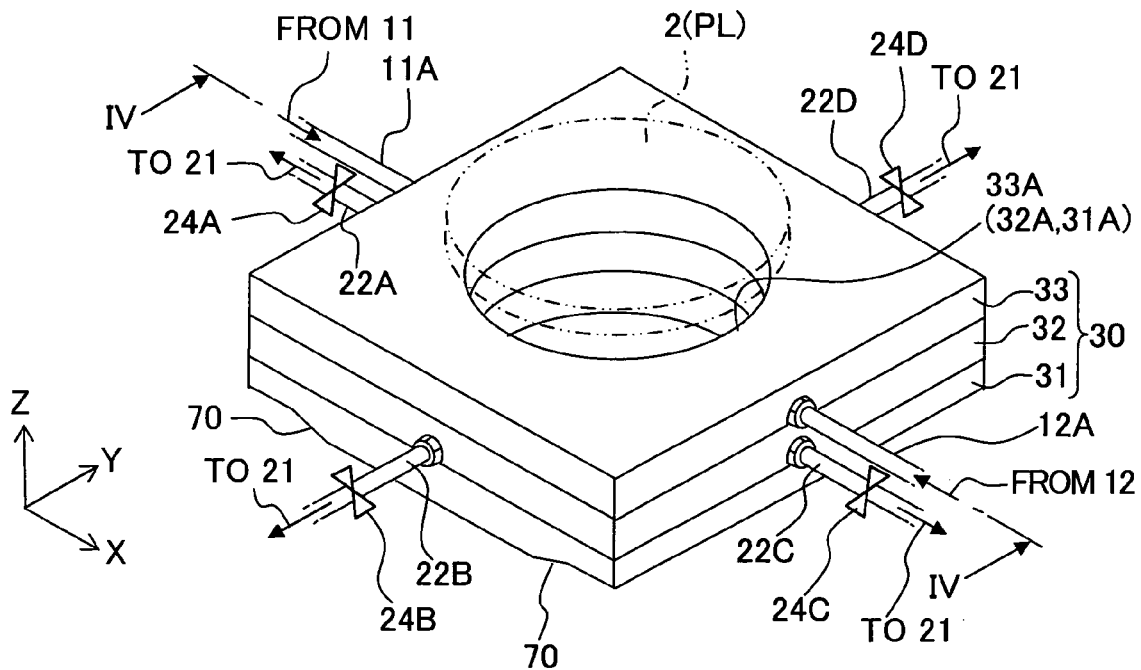
FIG. 2 is a perspective view of a flow passage-forming member 30 shown in FIG. 1.

FIG. 2 is a perspective view schematically illustrating the flow passage-forming member 30. As shown in FIG. 2, the flow passage-forming member 30 is the annular member which is provided to surround the circumference of the optical element 2 at the terminal end of the projection optical system PL. The flow passage-forming member 30 is provided with a first member 31, a second member 32 which is arranged on the upper portion of the first member 31, and a third member 33 which is arranged on the upper portion of the second member 32. Each of the first to third members 31 to 33 is a plate-shaped member; and the first to third members 31 to 33 have holes 31A to 33A respectively each of which is formed at the central portion thereof and in which the projection optical system PL (optical element 2) can be arranged.

Figure 3:
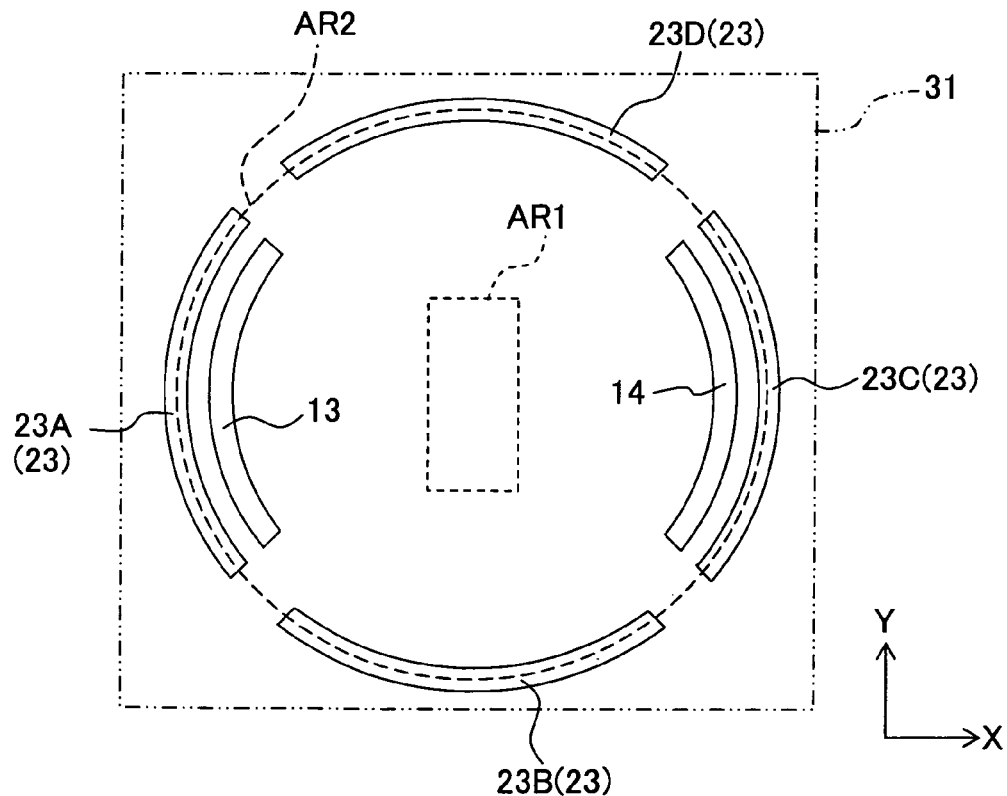
FIG. 3 is a plan view of a construction of supply ports and recovery ports for the liquid shown in FIG. 1.

FIG. 3 is a perspective view of the first member 31 which is included in the first to third members 31 to 33 shown in FIG. 2 and which is arranged at the lowermost position among the first to third members 31 to 33. With reference to FIG. 3, the first member 31 is provided with the first supply port 13 which is formed on a side in the −X direction of the projection optical system PL and from which the liquid 1 is supplied onto the substrate P, and the second supply port 14 which is formed on a side in the +X direction of the projection optical system PL and from which the liquid 1 is supplied onto the substrate P. Each of the first supply port 13 and the second supply port 14 is a through-hole which penetrates through the first member 31 and which is formed to have a substantially circular arc-shaped form as seen in a plan view. Further, the first member 31 is provided with the first recovery port 23A, the second recovery port 23B, the third recovery port 23C, and the fourth recovery port 23D which are formed on the sides in the −X direction, the −Y direction, the +X direction, and the +Y direction respectively of the projection optical system PL and each of which recovers the liquid 1 on the substrate P. Each of the first to fourth recovery ports 23A to 23D is also a through-hole which penetrates through the first member 31 and which is formed to have a substantially circular arc-shaped form as seen in a plan view. The first to fourth recovery ports 23A to 23D are provided at substantially equal intervals along with the circumference of the projection optical system PL, and are disposed at the outside of the projection optical system PL than the supply ports 13, 14. The gap between the supply ports 13, 14 and the substrate P and the gap between the recovery ports 23A to 23D and the substrate P are provided substantially identically. In other words, the height positions of the supply ports 13, 14 and the height positions of the recovery ports 23A to 23D are provided at an approximately same height.

With reference to FIG. 1 again, the flow passage-forming member 30 has recovery flow passages 84 (84A, 84B, 84C, 84D) which are provided therein and which are communicated with the recovery ports 23A to 23D (see FIG. 3). The recovery flow passages 84B, 84D (not shown) are flow passages to make communication between the recovery ports 23B, 23D disposed in the non-scanning direction as shown in FIG. 3 and the recovery tubes 22B, 22D shown in FIG. 2. The other end of each of the recovery flow passages 84A to 84D is communicated with the liquid recovery section 21 via one of the recovery tubes 22A to 22D shown in FIG. 2. In this embodiment, the flow passage-forming member 30 forms a part of the liquid supply mechanism 10 and a part of the liquid recovery mechanism 20. That is, the flow passage-forming member 30 is a part of the liquid immersion mechanism of this embodiment. A part or parts of the liquid immersion mechanism, for example, at least the flow passage-forming member 30 may be supported in a hanging manner on the main frame (including the barrel surface plate described above) for retaining or holding the projection optical system PL, or a part or parts of the liquid immersion mechanism may be provided on any frame member distinct from the main frame. Alternatively, in a case that the projection optical system PL is supported in the hanging manner as described above, the flow passage-forming member 30 may be supported in a hanging manner integrally with the projection optical system PL. Alternatively, the flow passage-forming member 30 may be provided on a measuring frame supported in a hanging manner independently from the projection optical system PL. In the latter case, it is also allowable that the projection optical system PL is not supported in the hanging manner.

The first to fourth valves 24A to 24D, which are provided for the first to fourth recovery tubes 22A to 22D respectively, open/close the flow passages of the first to fourth recovery tubes 22A to 22D respectively. The operations of the first to fourth valves 24A to 24D are controlled by the controller CONT. The liquid recovery mechanism 20 is capable of sucking and recovering the liquid 1 from the recovery ports 23 (23A to 23D) during the period in which the flow passages of the recovery tubes 22 (22A to 22D) are open. When the flow passages of the recovery tubes 22 (22A to 22D) are closed by the valves 24 (24A to 24D), the sucking and the recovery of the liquid 1 via the recovery ports 23 (23A to 23D) are stopped.

With reference to FIG. 1, the liquid supply operations of the first and second liquid supply sections 11, 12 are controlled by the controller CONT. The controller CONT is capable of independently controlling the liquid supply amounts per unit time to be supplied onto the substrate P by the first and second liquid supply sections 11, 12 respectively. The liquid 1, which is fed from the first and second liquid supply sections 11, 12, is supplied onto the substrate P from the supply ports 13, 14 (see FIG. 3) provided on the lower surface of the flow passage-forming member 30 (first member 31) to be opposite to the substrate P, via the supply tubes 11A, 12A and the supply flow passages 82A, 82B of the flow passage-forming member 30.

The liquid recovery operation of the liquid recovery section 21 is controlled by the controller CONT. The controller CONT is capable of controlling the liquid recovery amount per unit time to be recovered by the liquid recovery section 21. The liquid 1 on the substrate P, recovered from the recovery ports 23 provided on the lower surface of the flow passage-forming member 30 (first member 31) to be opposite to the substrate P, is recovered by the liquid recovery section 21 via the recovery tubes 22 and the recovery flow passages 84 of the flow passage-forming member 30. A liquid trap surface (inclined surface) 70, which has a predetermined length to capture the liquid 1, is formed on the lower surface (surface directed toward the substrate P) of the flow passage-forming member 30 so that the liquid trap surface 70 is disposed outside the projection optical system PL with respect to the recovery ports 23. The trap surface 70 is subjected to the liquid-attracting process. The liquid 1, which outflows to the outside of the recovery ports 23, is captured by the trap surface 70.

FIG. 3 also is a plan view of the positional relationship between the projection area AR1 of the projection optical system PL and the first and second supply ports 13, 14 and the first to fourth recovery ports 23A to 23D formed on the flow passage-forming member 30 shown in FIG. 2. With reference to FIG. 3, the projection area AR1 of the projection optical system PL is defined to have a rectangular shape in which the Y direction (non-scanning direction) is the longitudinal direction. The liquid immersion area AR2, which is filled with the liquid 1, is formed inside a substantially circular area substantially surrounded by the four recovery ports 23A to 23D so that the projection area AR1 is included in the liquid immersion area AR2. Further, the liquid immersion area AR2 is locally formed on a part of the surface of the substrate P (or to include a part of the surface of the substrate P) during the scanning exposure.

The first and second supply ports 13, 14 are formed to have the substantially circular arc- and slit-shaped forms on the both side of the projection area AR1 to interpose the projection area AR1 between the first and second supply ports 13 and 14 in relation to the scanning direction (X direction). The length of the supply port 13, 14 in the Y direction is longer than at least the length of the projection area AR1 in the Y direction. The liquid supply mechanism 10 is capable of supplying the liquid 1 simultaneously on the both sides of the projection area AR1 from the two supply ports 13, 14.

The first to fourth recovery ports 23A to 23D are formed to have the circular arc- and slit-shaped forms to surround the supply ports 13, 14 and the projection area AR1. The recovery ports 23A, 23C, which are included in the plurality of (four) recovery ports 23A to 23D, are arranged on the both sides of the projection area AR1 while interposing the projection area AR1 in relation to the X direction (scanning direction). The recovery ports 23B, 23D are arranged on the both sides of the projection area AR1 while interposing the projection area AR1 in relation to the Y direction (non-scanning direction). The lengths of the recovery ports 23A, 23C in the Y direction are longer than the lengths of the supply ports 13, 14 in the Y direction. The recovery ports 23B, 23D are formed to have approximately the same lengths as those of the recovery ports 23A, 23C respectively as well. The recovery ports 23A to 23D are communicated with the liquid recovery section 21 shown in FIG. 1 via the recovery tubes 22A to 22D shown in FIG. 2 respectively. In this embodiment, the number of the recovery ports 23 is not limited to four. Single or any arbitrary plural number of recovery port or ports 23 may be provided on condition that the recovery port or ports 23 is/are arranged to surround the projection area AR1 and the supply ports 13, 14.

The flow passage-forming member 30 used in the embodiment described above is not limited to the structure described above. For example, it is also possible to use those described in European Patent Application Publication No. 1420298, International Publication Nos. 2004/055803, 2004/057589, and 2004/057590, and International Publication No. 2005/029559 (corresponding to United States Patent Application Publication No. 2006/0231206). In this embodiment, the supply ports 13, 14 and the recovery ports 23A to 23D for the liquid are provided on the same flow passage-forming member 30. However, the supply ports 13, 14 and the recovery ports 23A to 23D may be provided on distinct members. Further, for example, as disclosed in International Publication No. 2005/122218, a second recovery port (nozzle) for recovering the liquid may be provided at the outside of the flow passage-forming member 30. Further, it is also allowable that the supply ports 13, 14 are not arranged to be opposite to the substrate P. Further, the lower surface of the flow passage-forming member 30 is arranged or set to be at an approximately same height (Z position) as that of the lower end surface (light exit surface) of the projection optical system PL. However, for example, the lower surface of the flow passage-forming member 30 may be set at a position nearer to the image plane side (substrate side) than the lower end surface of the projection optical system PL. In this case, a part (lower end portion) of the flow passage-forming member 30 may be provided to extend crawlingly until arrival at a position under or below the projection optical system PL (optical element 2) so as not to block or shield that the exposure light EL.

Description of Liquid Sucking Mechanism in Substrate Holder PH

With reference to FIG. 1, the substrate holder PH of this embodiment is provided with the sucking mechanism which discharges, to the outside, the liquid inflowed into the side of the back surface (back surface side) of the substrate P. The exposure apparatus EX of this embodiment is constructed so that the substrate P as the exposure objective coated with the resist and is disposed on the substrate holder PH can be exchanged with a dummy substrate CP as a substrate having a substantially same shape as that of the substrate P, by an unillustrated wafer loader system, if necessary. As described later on, the exposure apparatus of this embodiment executes step of cleaning (or washing) the upper portion of the substrate stage PST, the upper surface of the substrate holder PH (plate portion 97), etc. in this embodiment during the period in which the substrate P is not exposed. In this procedure, in order to avoid any inflow of the liquid, for example, into holes for the vacuum attraction on the inner surface of the substrate holder PH, the dummy substrate CP is placed on the substrate holder PH instead of the substrate P. Therefore, the dummy substrate CP can be also referred to as "lid substrate", "lid wafer", or "cover member" for covering the inner surface of the substrate holder PH.

Figure 5:
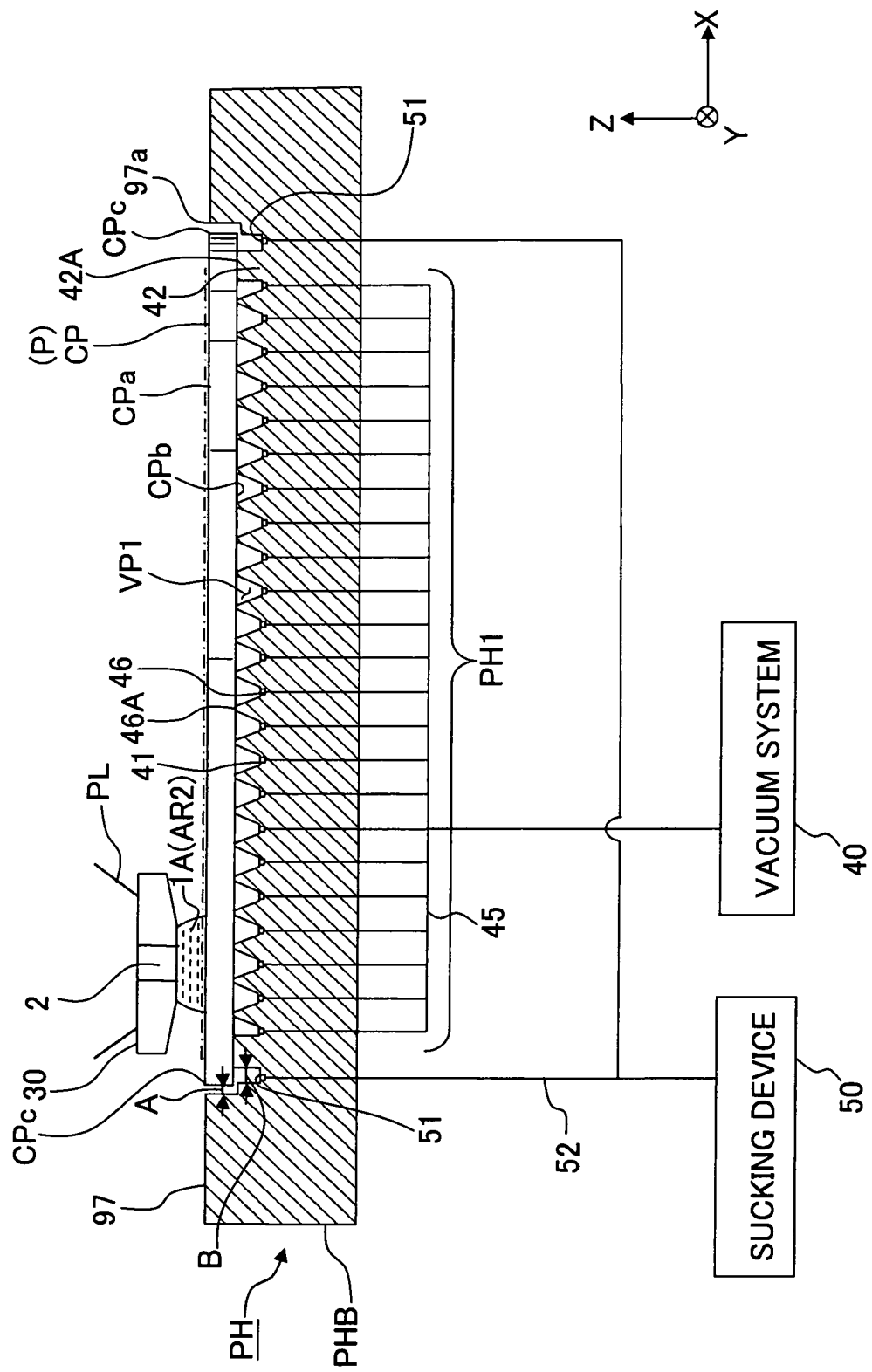
FIG. 5 is a sectional view of an attracting mechanism and a sucking mechanism of a substrate holder PH shown in FIG. 1.

The dummy substrate CP is formed of, for example, a liquid-attractive substrate which has relatively high affinity for the liquid 1 and which is composed of a silicon substrate or the like. For example, as shown in FIG. 5, the liquid-repelling process is performed to an upper surface portion CPa except for an end portion (circumferential edge portion) of the upper surface and the side surface) CPc of the substrate in order to repel the liquid 1. In other words, the end portion CPc of the dummy substrate CP is liquid-attractive, and the upper surface portion CPa disposed at the inside of the end portion CPc and the back surface portion of the dummy substrate CP are liquid-repellent. The liquid-repelling process includes, for example, a coating process in which a liquid-repellent material is coated to form a liquid-repellent coat. The material having the liquid repellence includes, for example, synthetic resins such as polyethylene, silicon compounds, and fluorine-based compounds. The liquid-repellent coat may be a single layer film, or it may be a film constructed of a plurality of layers. The entire surface (front surface) of the dummy substrate CP, which makes contact with the liquid 1, may be liquid-repellent.

Figure 6:
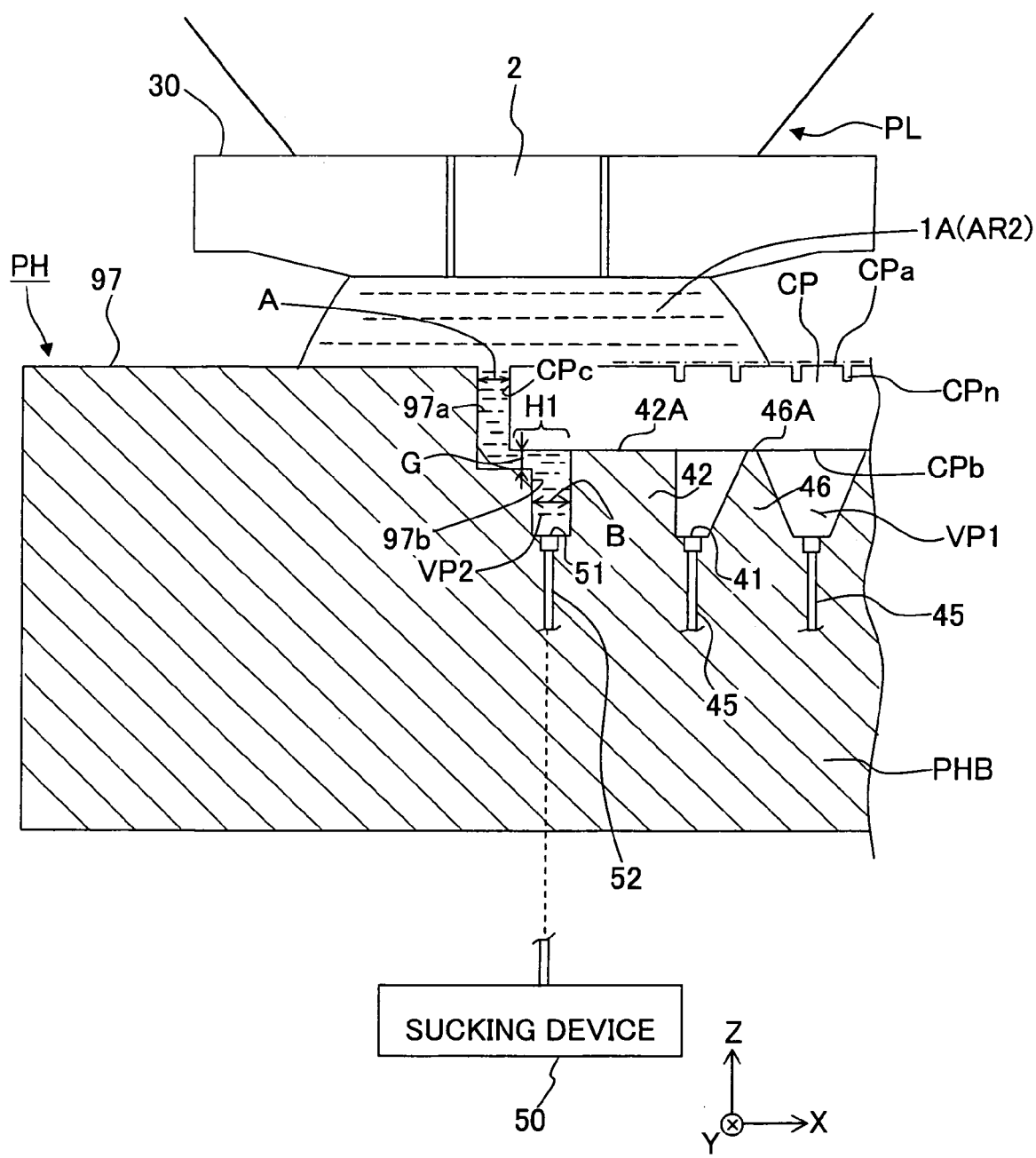
FIG. 6 is a magnified view of main components shown in FIG. 5.

For example, as shown in a magnified view of FIG. 6, a plurality of lyophilic or liquid-attractive grooves CPn, each of which has a width of, for example, about 1 mm, may be formed at predetermined intervals in an area of the upper surface portion CPa of the dummy substrate CP, the area being coated with the liquid-repellent coat. The substrate itself of the dummy substrate CP is liquid-attractive. Therefore, in order to form the liquid-attractive grooves CPn, the grooves may be mechanically formed in the upper surface portion CPa after applying the liquid-repellent coat to the upper surface portion CPa. The grooves CPn are used to capture particles as fine or minute foreign matter entered in and mixed with the liquid 1 during the cleaning of the substrate holder PH. Note that the dummy substrate CP may be formed of a liquid-repellent material.

With reference to FIGS. 5 and 6, an explanation will be made in detail below about the construction of the substrate holder PH shown in FIG. 1. FIG. 5 is a side sectional view of the substrate holder PH in a state that the dummy substrate CP is attracted and held. FIG. 6 is a magnified view of main components shown in FIG. 5.

As shown in FIG. 5, the substrate holder PH includes a base member PHB, and a holding portion PH1 which is formed on the base member PHB and which attracts and holds by suction the dummy substrate CP (or the substrate P as the exposure objective, the same assumption is applied to the following description as well). The holding portion PH1 includes a large number of support portions 46 each of which is small and has a conical shape with a flat upper surface 46A and which are formed on the base member PHB to support the back surface CPb of the dummy substrate CP; and a circumferential wall portion (rim portion) 42 which is formed on the base member PHB, which is opposite to or faces the back surface CPb of the dummy substrate CP, and which has a circumferential shape to surround the large number of support portions 46. The holding portion PH1 is arranged in a recess 97a which is formed in the substrate holder PH and in which the dummy substrate CP is accommodated.

Each of the large number of support portions 46 functions as a protruding support pin which supports the dummy substrate CP from the back surface. Further, the large number of support portions 46 are arranged at predetermined pitches in the X direction and the Y direction at the inside of the circumferential wall portion 42 having the circumferential form. A lifting rod (not shown) is also provided at the central portion of the holding portion PH1 in order to move the dummy substrate CP upwardly and downwardly. The circumferential wall portion 42 is formed to have a substantially annular shape in conformity with the shape of the dummy substrate CP (or the substrate P). The flat upper surface 42A of the circumferential wall portion 42 is provided to be opposite or to face to the circumferential edge area (edge area) of the back surface CPb of the dummy substrate CP. In this embodiment, the upper surface 46A of the support portion 46 is formed to have a height same as that of the upper surface 42A of the circumferential wall portion 42, or the upper surface 46A of the support portion 46 is formed to be slightly higher than the upper surface 42A. A first space VP1, which is surrounded by the dummy substrate CP, the circumferential wall portion 42, and the base member PHB, is formed on the side of the back surface CPb of the dummy substrate CP held by the holding portion PH1.

With reference to FIG. 5, a large number of suction ports 41 are formed on the base member PHB, inside the circumferential wall portion 42 and at valley portions between the large number of support portions 46. The suction ports 41 are provided in order to attract by suction (suction-attracts) and hold the dummy substrate CP. Each of the large number of suction ports 41 is connected to a vacuum system 40 including a vacuum pump via flow passages 45. The holding portion PH1, which includes the support portions 46, the circumferential wall portion 42, the suction ports 41, and the flow passages 45, constitutes the so-called pin chuck mechanism for attracting and holding the dummy substrate CP (or the substrate P). The controller CONT shown in FIG. 1 drives the vacuum system 40 to suck the gas (air) in the first space VP1 so as to negatively pressurize the first space VP1, thereby suction-attracting and holding the back surface CPb of the dummy substrate CP on the upper surfaces 46A of the large number of support portions 46.

As shown in FIG. 6, an inner side surface, which is connected to the plate portion 97 and which is opposite to or faces the side surface of the dummy substrate CP attracted and held by the holding portion PH1, is formed on the recess 97a of the substrate holder PH. A predetermined gap A is formed between the side surface of the dummy substrate CP held by the holding portion PH1 and the inner side surface of the recess 97a (or the plate portion 97) provided around the dummy substrate CP. In this embodiment, the gap A is, for example, about 0.1 to 1.0 mm.

As shown in FIG. 6, a recess 97b is formed on the bottom surface of the recess 97a of the substrate holder PH, along the outer side surface of the first circumferential wall portion 42. A gap B is formed along the outer side surface between the inner side surface of the recess 97b and the outer side surface of the circumferential wall portion 42. In this embodiment, the gap B is defined to be, for example, about 1.0 mm. The outer diameter of the annular circumferential wall portion 42 is formed to be smaller than the outer diameter of the dummy substrate CP (or the substrate P). The edge area of the dummy substrate CP overhangs by a predetermined amount toward the outside of or beyond the circumferential wall portion 42. In this embodiment, an overhang portion H1 is, for example, about 1.5 mm.

The inner diameter of the inner side surface of the recess 97b is formed to be smaller than the outer diameter of the dummy substrate CP. The bottom surface of the recess 97a is formed to be slightly lower than the upper surface 42A of the circumferential wall portion 42 by a gap G. In this embodiment, the gap G is defined to be 1 to 1,000 μm. As a result, a second space VP2 of the gap B is formed at the outside of the circumferential wall portion 42 on the back surface side of the dummy substrate CP held by the holding portion PH1. The second space VP2 is communicated with the outside air of the substrate holder PH via the gap A and the gap G between the recess 97a and the dummy substrate CP.

As shown in FIG. 6, on the bottom surface of the recess 97 of the substrate holder PH opposite to the back surface of the dummy substrate CP, recovery ports 51, each of which has a substantially circular shape as seen in a plan view, are provided at a plurality of predetermined positions (for example, seven positions) respectively disposed along the outer side surface of the circumferential wall portion 42. The recovery ports 51 are connected via flow passages 52 respectively to the sucking device 50 including the vacuum system. The sucking is performed by the sucking device 50 so that the second space VP2 is negatively pressurized via the recovery ports 51. By doing so, when the boundary portion between the dummy substrate CP and the plate portion 97 passes across the liquid immersion area AR2, the liquid 1 inflowing into the second space VP2 via the gap A and the gap G can be discharged to the outside of the substrate holder PH from the bottom surface side of the dummy substrate CP. In this procedure, the back surface CPb of the dummy substrate CP makes tight contact with the upper surface 42A of the circumferential wall portion 42 shown in FIG. 6 by the vacuum system 40 shown in FIG. 5. Therefore, the liquid 1 is not allowed to inflow from the second space VP2 into the first space VP1 on the back surface of the dummy substrate CP, thereby avoiding any erroneous operation of the vacuum system 40, etc.

The sucking device 50 which is connected to the second space VP2 via the recovery ports 51 and the vacuum system 40 which is provided to allow the first space VP1 to have the negative pressure are independent from each other. The controller CONT is capable of controlling the operations of the sucking device 50 and the vacuum system 40 individually or independently. It is possible to perform the sucking operation for sucking the liquid by the sucking device 50 and the sucking operation for sucking the gas by the first vacuum system 40 independently from each other.

Further, the liquid-repelling process is performed to at least a part of the substrate holder PH. The substrate holder PH has the liquid repellence with respect to the liquid 1. In this embodiment, the upper surface 42A and the outer side surface of the circumferential wall portion 42 of the holding portion PH1 and the upper surfaces 46A of the support portions 46, which are included in the base member PHB of the substrate holder PH, have the liquid repellence. Further, the plate portion 97 and the inner side surface and the bottom surface of the recess 97a also have the liquid repellence. Further, the inner side surface of the recess 97b also has the liquid repellence.

The liquid-repelling process for the substrate holder PH includes a process in which a liquid-repellent material such as a fluorine-based resin material or an acrylic resin material is subjected to the coating.

As for the substrate holder PH shown in FIG. 5, the plate portion 97 may be a ring-shaped exchangeable plate member; and the liquid-repelling process may be performed to the surface of the plate member, and the plate member may be supported by members which are the same as or equivalent to the support portions 46 so that the plate member may be held from the bottom surface side by the vacuum attraction. Accordingly, for example, if any dirt or contamination, which cannot be removed by the cleaning process as described later on, is adhered, it is possible to exchange only the plate member at any time.

In the explanation concerning FIGS. 5 and 6 described above, the dummy substrate CP is held by the substrate holder PH. However, the substrate P as the exposure objective can be also held by the substrate holder PH in the same manner as described above. Also in this case, the height (position in the Z direction) of the plate portion 97 is defined so that the surface of the substrate P and the surface of the plate portion 97 are substantially disposed on the same plane.

Description of Measuring Stage

With reference to FIG. 1 again, the measuring stage MST includes an X stage portion 181 which has an oblong plate shaped form long in the Y direction and which is driven in the X direction (scanning direction); a leveling table 188 which is placed on the X stage portion 181, for example, with an air bearing intervening therebetween; and a measuring table MTB which serves as a measuring unit arranged on the leveling table 188. As an example, the measuring table MTB is placed on the leveling table 188 with an air bearing intervening therebetween. However, the measuring table MTB and the leveling table 188 can be integrated into one integrated body as well. The X stage portion 181 is placed movably in the X direction on the base 54 with an air bearing intervening therebetween.

FIG. 8A is a plan view of the substrate stage PST and the measuring stage MST shown in FIG. 1. With reference to FIG. 8A, X axis stators 186, 187, each of which includes a plurality of permanent magnets arranged in a predetermined arrangement in the X direction on the inner surface, are installed in parallel to the X axis so as to interpose the base 54 in the Y direction (non-scanning direction) between the X axis stators 186, 187. A Y axis slider 180 is arranged movably in the X direction substantially in parallel to the Y axis, between the stators 186, 187 via movers 182, 183 which include coils respectively. The substrate stage PST is arranged movably in the Y direction along the Y axis slider 180. A Y axis linear motor, which drives the substrate stage PST in the Y direction, is constructed by movers included in the substrate stage PST and stators (not shown) disposed on the Y axis slider 180. A pair of X axis linear motors, which drive the substrate stage PST in the X direction, are constructed by the movers 182, 183 and the stators 186, 187 corresponding to the movers 182, 183 respectively. The X axis linear motor, the Y axis linear motor, etc. construct the substrate stage-driving device PSTD shown in FIG. 1.

On the other hand, an X stage portion 181 of the measuring stage MST is arranged movably in the X direction, between stators 186, 187 via movers 184, 185 including coils respectively. A pair of X axis linear motors, which drive the measuring stage MST in the X direction, are constructed by the movers 184, 185 and the stators 186, 187 corresponding to the movers 184, 185 respectively. The X axis linear motors, etc. are represented as the measuring stage-driving device TSTD in FIG. 1.

With reference to FIG. 8A, a stator 167 which has a "]"-shaped cross-sectional form and in which a plurality of permanent magnets are arranged to generate uniform magnetic field in the Z direction, to be opposite to the inner surface and a stator 171 which has a flat plate-shaped form and which includes a coil wound (arranged) substantially along the X axis are successively fixed to an end of the X stage portion 181 in the −X direction so that the stators 167 and 171 are disposed-substantially in parallel to the Y axis and are stacked in the Z direction. Movers 166A, 166B, which include coils wound (arranged) along the Y axis respectively, are fixed at two positions respectively, the two positions being separated in the Y direction on the measuring table MTB so that the movers 166A, 166B are arranged in the stator 167 disposed at the lower position. A mover 170, which has a "]"-shaped cross-sectional form and in which a plurality of permanent magnets are arranged in a predetermined arrangement in the Y direction, is fixed to the measuring table MTB so that the stator 171 disposed at the upper position is interposed in the Z direction. X axis voice coil motors 168A, 168B (see FIG. 1), which drive the measuring table MTB in the X direction and the θZ direction with respect to the X stage portion 181 respectively, are constructed by the movers 166A, 166B and the stator 167 disposed at the lower position. A Y axis linear motor 169, which drives the measuring table MTB in the Y direction with respect to the X stage portion 181, is constructed by the mover 170 and the stator 171 disposed at the upper position.

An X axis reflecting mirror 55CX and a Y axis reflecting mirror 55CY are fixed in the −X direction and the +Y direction respectively on the measuring table MTB. An X axis laser interferometer 56C is arranged to be opposite to the reflecting mirror 55CX in the −X direction. The reflecting mirrors 55CX, 55CY are represented by the reflecting mirror 55C in FIG. 1. The laser interferometer 56C is a multi-axis laser interferometer; and the position in the X direction, the angle of rotation in the θZ direction, etc. of the measuring table MTB are always measured by the laser interferometer 56C. Instead of the reflecting mirror 55C, it is allowable to use, for example, a reflecting surface, which is formed by mirror-finishing a side surface, etc. of the measuring stage MST.

On the other hand, with reference to FIG. 8A, the laser interferometer 56BY, which is provided to measure the position in the Y direction, is commonly used for the substrate stage PST and the measuring stage MST. That is, the optical axes of the two X axis laser interferometers 56BX, 56C pass through the center of the projection area AR1 of the projection optical system PL (coincident with the optical axis AX shown in FIG. 1 in this embodiment), and the optical axes are parallel to the X axis. The optical axis of the Y axis laser interferometer 56BY passes through the center of the projection area of the projection optical system PL (optical axis AX), and the optical axis is parallel to the Y axis. Therefore, usually, when the substrate stage PST is moved to a position under or below the projection optical system PL in order to perform the scanning exposure, then the laser beam of the laser interferometer 56BY is irradiated onto the reflecting mirror 55BY of the substrate stage PST, and the position of the substrate stage PST (substrate P) in the Y direction is measured by the laser interferometer 56BY. For example, when the measuring table MTB of the measuring stage MST is moved to the position under or below the projection optical system PL in order to measure the image formation characteristic of the projection optical system PL, etc., then the laser beam of the laser interferometer 56BY is irradiated onto the reflecting mirror 55CY of the measuring table MTB, and the position of the measuring table MTB in the Y direction is measured by the laser interferometer 56BY. Accordingly, the positions of the substrate stage PST and the measuring table MTB can be always measured highly accurately, with the center of the projection area of the projection optical system PL as a reference. Further, it is possible to decrease the number of laser interferometers which are highly accurate but expensive, thereby making it possible to reduce the production cost.

Linear encoders (not shown) of the optical system, etc. are arranged along the Y axis linear motor for the substrate stage PST and the Y axis linear motor 169 for the measuring table MTB. The position in the Y direction of the substrate stage PST or the measuring table MTB is measured by one of the linear encoders during a period in which the laser beam of the laser interferometer 56BY is not irradiated onto the reflecting mirror 55BY or 55CY.

With reference to FIG. 1 again, the position in the two-dimensional direction and the angle of rotation of the measuring table MTB are measured by the laser interferometer 56C and the laser interferometer 56BY shown in FIG. 8(A) (or the linear encoder). An obtained result of the measurement is outputted to the controller CONT. The controller CONT drives the measuring stage-driving device TSTD, the linear motor 169, and the voice coil motors 168A, 168B based on the measurement result, thereby moving or positioning the measuring table MTB of the measuring stage MST.

The leveling table 188 is provided with three Z axis actuators each of which is capable of controlling the position in the Z direction, for example, with an air cylinder or a voice coil motor system. The position in the Z direction and the angles in the θX direction and the θY direction of the measuring table MTB are controlled by the leveling table 188 so that the upper surface of the measuring table MTB is focused with respect to the image plane of the projection optical system PL. For this purpose, an autofocus sensor (not shown) is provided in the vicinity of the flow passage-forming member 30 in order to measure the position of the detection objective surface such as the upper surface of the substrate P disposed in the projection area AR1 and in the vicinity of the projection area AR1. The controller CONT controls the operation of the leveling table 188 based on the measured value obtained by the autofocus sensor. Further, although not shown, an actuator is also provided in order that the position of the leveling table 188 in the X direction, the Y direction, and the θZ direction with respect to the X stage portion 181 is maintained at a predetermined position.

The autofocus sensor also detects information about the inclination in the θX and θY directions (angle of rotation) by measuring the position information in the Z direction about the detection objective surface at a plurality of measuring points thereof respectively. At least a part or parts of the plurality of measuring points may be defined in the liquid immersion area AR2 (or in the projection area AR1). Alternatively, all of the plurality of measuring points may be defined at the outside of the liquid immersion area AR2. Further, for example, when the laser interferometers 56B, 56C are capable of measuring the position information in the Z axis, θX, and θY directions about the detection objective surface, then it is also allowable that the autofocus sensor is not provided for the purpose of making it possible to measure the position information in the Z direction during the exposure operation of the substrate P; and it is also allowable that the position of the detection objective surface is controlled in relation to the Z axis; θX, and θY directions by using the measurement results of the laser interferometers 55B, 55C at least during the exposure operation.

The measuring table MTB of this embodiment is provided with measuring devices (measuring members) for performing various types of measurement in relation to the exposure. That is, the measuring table MTB is provided with a body 159 of the measuring table (measuring-table body 159) to which the reflecting mirror 55C, the mover, etc. of the linear motor 169 are fixed; and a plate 101 which is fixed to the upper surface of measuring-table body 159 and which is composed of a light-transmissive material having a low coefficient of expansion including, for example, silica glass. A chromium film is formed on the substantially entire surface of the plate 101; and the plate 101 has, at a several positions of the plate 101, an area for the measuring device and a reference mark area FM having a plurality of reference marks formed therein, as disclosed, for example, in Japanese Patent Application Laid-open No. 5-21314 (corresponding to U.S. Pat. No. 5,243,195).

As shown in FIG. 8A, a pair of reference marks FM1, FM2 for an alignment sensor 90 for the mask shown in FIG. 1 and a reference mark FM3 for an alignment sensor ALG for the substrate arranged on a side surface of the projection optical system PL are formed in the reference mark area FM on the plate 101. By measuring the positions of the reference marks with the corresponding alignment sensors respectively, it is possible to measure the baseline amount as the spacing distance (positional relationship) between the projection position of the projection area AR1 of the projection optical system PL and the detecting position of the alignment sensor ALG. Upon measuring the baseline amount, the liquid immersion area AR2 is formed on the plate 101. The alignment sensor 90 is used to detect the positional relationship between the mark of the mask M and the reference marks FM1, FM2. The alignment sensor ALG is used to detect the position information about the alignment mark on the substrate P and the reference mark FM3. Each of the alignment sensors 90, ALG of this embodiment performs the mark detection in accordance with the image processing system. However, it is also allowable to adopt any other system including, for example, a system in which a diffracted light beam generated from the mark by the irradiation of a coherent beam is detected.

Various types of measuring aperture patterns are formed in the area for the measuring devices on the plate 101. The measuring aperture patterns include, for example, an aperture pattern for measuring a spatial image (for example, a slit-shaped aperture pattern), a pinhole aperture pattern for measuring uneven illuminance, an aperture pattern for measuring illuminance, and an aperture pattern for measuring wave aberration. Measuring devices, corresponding to the aperture patterns respectively and each constructed of a measuring optical system and a photoelectric sensor, are arranged in the measuring-table body 159 located on the bottom surface side of the aperture patterns.

Examples of the measuring devices include, for example, an uneven illuminance sensor as disclosed, for example, in Japanese Patent Application Laid-open No. 57-117238 (corresponding to U.S. Pat. No. 4,465,368), a spatial image-measuring device for measuring the light intensity of a spatial image (projected image) of a pattern projected by the projection optical system PL as disclosed, for example, in Japanese Patent Application Laid-open No. 2002-14005 (corresponding to United States Patent Application Publication No. 2002/0041377), an illuminance monitor as disclosed, for example, in Japanese Patent Application Laid-open No. 11-16816 (corresponding to United States Patent Application Publication No. 2002/0061469), and a wave aberration-measuring device as disclosed, for example, in International Publication No. 99/60361 (corresponding to European Patent No. 1,079,223).

In this embodiment, in correspondence to that the liquid immersion exposure is performed to expose the substrate P with the exposure light EL via the projection optical system PL and the liquid 1, the exposure light EL is received via the projection optical system PL and the liquid 1, for example, in the uneven illuminance sensor, the illuminance monitor, the spatial image-measuring device, and the wave aberration-measuring device described above to be used for the measurement using the exposure light EL. Therefore, a liquid-repellent coat is applied to the surface of the plate 101. In this embodiment, the reference mark and at least one of the plurality of measuring devices described above are provided as the measuring members on the measuring table MTB. However, the type and/or the number, etc. of the measuring member or members are not limited to this. It is also allowable to provide, as the measuring member or members, for example, a transmittance-measuring device for measuring the transmittance of the projection optical system PL and/or a measuring device for observing the liquid immersion mechanism 8 described above, for example, the flow passage-forming member 30 (or the optical element 2). Further, only a part or parts of the measuring device may be provided on the measuring stage MST, and the remaining part or parts of the measuring device may be provided at the outside of the measuring stage MST. Any member different from the measuring device, which includes, for example, the cleaning member for cleaning the flow passage-forming member 30, the optical element 2, etc. may be provided on the measuring stage MST. It is also allowable that the measuring member, the cleaning member and the like are not provided on the measuring stage MST. In this case, the measuring stage MST is arranged to be opposite to or face the projection optical system PL while being exchanged with the substrate stage PST, in order to maintain the liquid immersion area AR2 described above, for example, during the exchange of the substrate P.

Exposure Step

Figure 15:
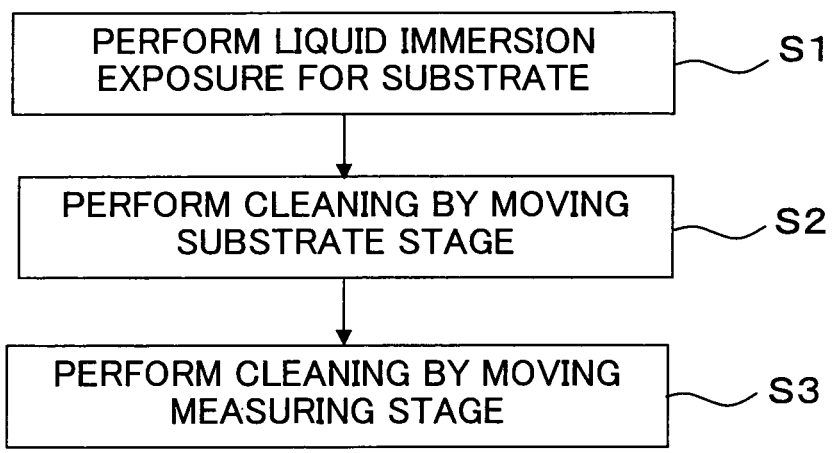
FIG. 15 is a flow chart of a specific example of the exposure method according to the first embodiment of the present invention.

Next, the exposure method and the maintenance method according to the present invention will be explained with reference to a flow chart shown in FIG. 15. In FIG. 1, a plurality of shot areas are defined on the substrate P. The controller CONT of this embodiment moves the substrate stage PST while monitoring the output of the laser interferometer 56B so that the substrate P is advanced or moved along with a predetermined route with respect to the optical axis AX (projection area AR1) of the projection optical system PL to successively expose the plurality of shot areas in the step-and-scan manner (Step S1 shown in FIG. 15). That is, a partial image of the pattern (partial pattern image) of the mask M is projected onto the rectangular projection area AR1 by the projection optical system PL during the scanning exposure effected by the exposure apparatus EX. The mask M is moved at a velocity V in the X direction with respect to the projection optical system PL, in synchronization with which the substrate P is moved at a velocity $\beta \cdot V$ ($\beta$ represents the projection magnification) via the substrate stage PST. After the exposure is completed on one shot area on the substrate P, the next shot area is moved to the scanning start position by the step-movement of the substrate P. The scanning exposure process is successively performed for the respective shot areas thereafter while moving the substrate P in the step-and-scan manner.

The controller CONT drives the liquid supply mechanism 10 during the exposure process for the substrate P to perform the liquid supply operation for supplying the liquid onto the substrate P. The liquid 1, which is fed from each of the first and second liquid supply sections 11, 12 of the liquid supply mechanism 10, flows through the supply tubes 11A, 12A, and then the liquid 1 is supplied onto the substrate P via the supply flow passages 82A, 82B formed in the flow passage-forming member 30.

The liquid 1 supplied onto the substrate P flows under or below the projection optical system PL in conformity with the movement of the substrate P. For example, when the substrate P is moved in the +X direction during the exposure of a certain shot area, the liquid 1 flows under or below the projection optical system PL at an approximately same velocity as that of the substrate P in the +X direction which is the same as the moving direction of the substrate P. In this state, the exposure light EL, which is radiated from the illumination optical system IL and which passes through the mask M, is irradiated onto the image plane side of the projection optical system PL, thereby exposing the substrate P with the pattern of the mask M via the projection optical system PL and the liquid 1 of the liquid immersion area AR2. The controller CONT performs the supply of the liquid 1 onto the substrate P by the liquid supply mechanism 10 when the exposure light EL is radiated onto the image plane side of the projection optical system PL, i.e., during the exposure operation for the substrate P. The liquid immersion area AR2 is formed satisfactorily by continuing the supply of the liquid 1 by the liquid supply mechanism 10 during the exposure operation. On the other hand, the controller CONT performs the recovery of the liquid 1 from the surface of the substrate P by the liquid recovery mechanism 20 when the exposure light EL is radiated onto the image plane side of the projection optical system PL, i.e., during the exposure operation for the substrate P. It is possible to suppress the expansion of the liquid immersion area AR2, etc. by continuously executing the recovery of the liquid 1 by the liquid recovery mechanism 20 during the exposure operation (when the exposure light EL is radiated onto the image plane side of the projection optical system PL).

In this embodiment, the liquid supply mechanism 10 supplies the liquid 1 onto the substrate P simultaneously from the both sides of the projection area AR1 through the supply ports 13, 14 during the exposure operation. Accordingly, the liquid 1, which is supplied from the supply ports 13, 14 onto the substrate P, is satisfactorily spread in the space between the substrate P and the lower end surface of the optical element 2 at the end portion of the projection optical system PL and the space between the substrate P and the lower surface of the flow passage-forming member 30 (first member 31), forming the liquid immersion area AR2 in a range which is wider than at least the projection area AR1.

Upon supplying the liquid 1 onto the substrate P from the both sides in the scanning direction of the projection area AR1, the controller CONT may control the liquid supply operations of the first and second liquid supply sections 11, 12 of the liquid supply mechanism 10 so that a liquid supply amount per unit time, which is to be supplied at a position approaching the projection area AR1 in relation to the scanning direction, is set to be greater than a liquid supply amount which is to be supplied at a position on the side opposite to the position approaching the projection area AR1. In this case, for example, there is such a possibility that when the substrate P is moved in the +X direction, the amount of the liquid to be moved toward the side in the +X direction with respect to the projection area AR1 might be increased, and thus a large amount of the liquid might outflow to the outside of the substrate P. However, the liquid 1, which is moved toward the side in the +X direction, is captured by the trap surface 70 provided on the lower surface on the +X side of the flow passage-forming member 30. Therefore, it is possible to suppress the inconvenience which would be otherwise caused such that the liquid scatters in and/or outflows to, for example, the surroundings of the substrate P.

It is also allowable that the recovery operation for recovering the liquid 1 by the liquid recovery mechanism 20 is not performed during the exposure operation, and that the flow passage of the recovery tube 22 is opened after the completion of the exposure to recover the liquid 1 on the substrate P. As an example, the liquid 1 may be recovered from on or the surface of the substrate P by the liquid recovery mechanism 20 only during a partial period (at least a part of the stepping period) after the completion of the exposure for a certain shot area on the substrate P and until the start of the exposure for the next shot area.

The controller CONT continues the supply of the liquid 1 by the liquid supply mechanism 10 during the exposure of the substrate P. By continuing the supply of the liquid 1 as described above, it is possible not only to fill the space between the projection optical system PL and the substrate P with the liquid 1 satisfactorily, but also possible to avoid the generation of the vibration of the liquid 1 (so-called the water hammer phenomenon). In this way, all of the shot areas on the substrate P can be subjected to the exposure by the liquid immersion method. The controller CONT moves the measuring stage MST to the position opposite to or facing the optical element 2 of the projection optical system PL, for example, during the exchange of the substrate P, to form the liquid immersion area AR2 on the measuring stage MST. In this case, the substrate stage PST and the measuring stage MST are moved in a state that the substrate stage PST and the measuring stage MST are close to each other, and when one of the stages is exchanged with the other of the stages, the one of the stages is arranged to be opposite to the optical element 2. With this, the liquid immersion area AR2 is moved between the substrate stage PST and the measuring stage MST. The controller CONT executes the measurement in relation to the exposure (for example, the baseline measurement) by using at least one measuring device (measuring member) provided on the measuring stage MST in a state that the liquid immersion area AR2 is formed on the measuring stage MST. Details of the operation for moving the liquid immersion area AR2 between the substrate stage PST and the measuring stage MST and the measuring operation of the measuring stage MST during the exchange of the substrate P are disclosed, for example, in International Publication No. 2005/074014 (corresponding to European Patent Application Publication No. 1713113) and International Publication No. 2006/013806. The exposure apparatus, which is provided with the substrate stage and the measuring stage, is disclosed, for example, in Japanese Patent Application Laid-open No. 11-135400 (corresponding to International Publication No. 1999/23692) and Japanese Patent Application Laid-open No. 2000-164504 (corresponding to U.S. Pat. No. 6,897,963). The contents of U.S. Pat. No. 6,897,963 is incorporated herein by reference within a range of permission of the domestic laws and ordinances of the designated state and the selected state.

Cleaning Step

When the substrate P shown in FIG. 1 makes contact with the liquid 1 of the liquid immersion area AR2 in the exposure step as described above, a part of a component of the substrate P is eluted into the liquid 1 in some cases. For example, when a chemical amplification type resist is used as the photosensitive material of the substrate P, the chemical amplification type resist includes a base resin, a photo acid generator (PAG) contained in the base resin, and an amine-based substance called "quencher". When the resist as described above makes contact with the liquid 1, a part of the components of the resist, specifically PAG, the amine-based compound, etc. are sometimes eluted into the liquid 1. Even in a case that the base material of the substrate P itself (for example, the silicon substrate) makes contact with the liquid 1, there is such a possibility that any part of the component of the base material (silicon, etc.) might be eluted into the liquid 1 depending on the substances for constructing the base material.

As described above, there is such a possibility that the liquid 1, which makes contact with the substrate P, might contain any minute foreign matter such as particles composed of resist residue, impurities, etc. generated from the substrate P. There is also such a possibility that the liquid 1 might contain any minute foreign matter such as impurities and dust contained in the atmospheric air, etc. Therefore, there is such a possibility that the liquid 1, which is recovered by the liquid recovery mechanism 20, might contain the foreign matter including various impurities, etc. In view of the above, the liquid recovery mechanism 20 discharges the recovered liquid 1 to the outside. At least a part of the recovered liquid 1 may be cleaned by an internal processing apparatus, and then the cleaned liquid 1 may be returned to the liquid supply mechanism 10.

It is feared that the minute foreign matter such as the particles, which enters into and mixes with the liquid 1 of the liquid immersion area AR2, might adhere to and remain on the upper surface of the substrate holder PH located at the upper portion of the substrate stage PST and/or the upper surface of the measuring table MTB on the measuring stage MST. It is feared that the foreign matter, which remains as described above, might enter into and mix with the liquid 1 of the liquid immersion area AR2 again during the exposure of the substrate P. If the foreign matter, which entered into and mixed with the liquid 1, adheres onto the substrate P, it is feared that any failure or inconvenience including, for example, the shape defect, might arise in the pattern formed on the substrate P.

Figure 4:
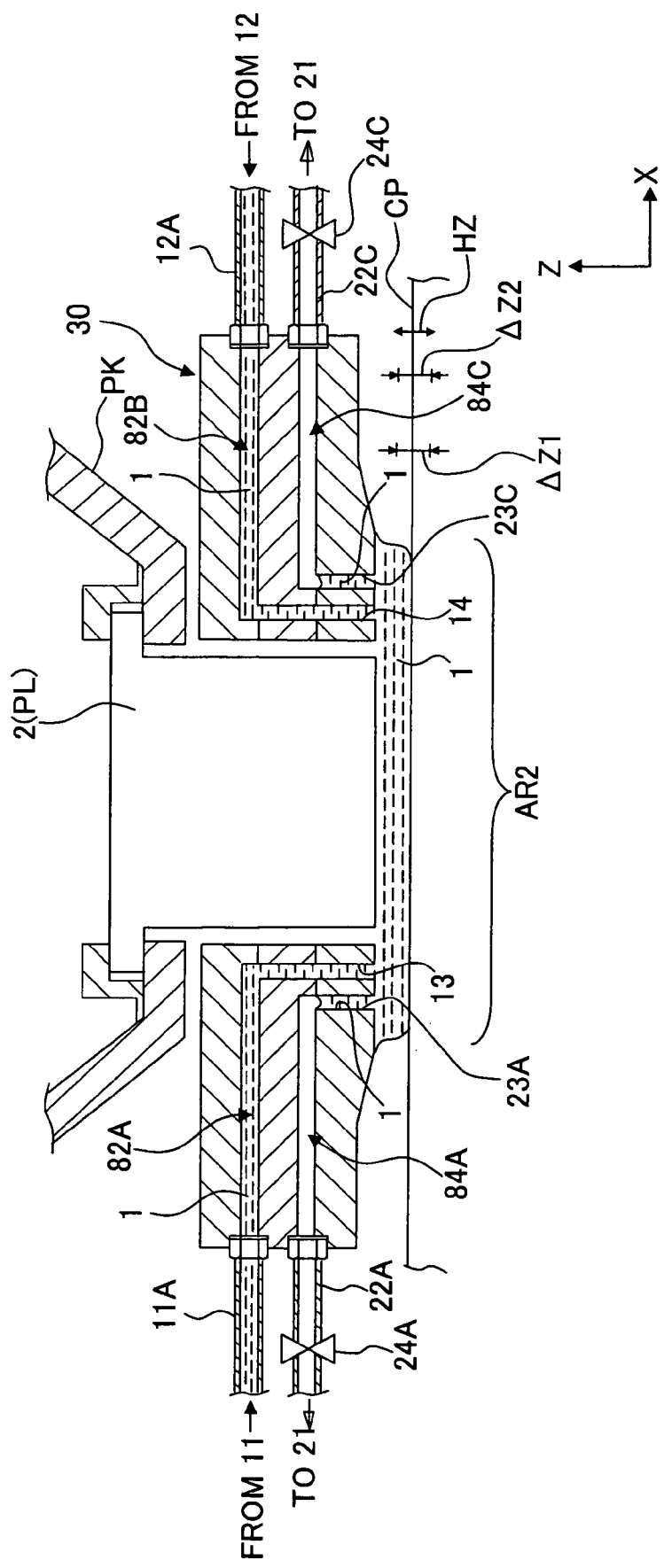
FIG. 4 is a sectional view taken along a line IV-IV shown in FIG. 2.

Accordingly, the exposure apparatus EX of this embodiment executes the cleaning step (Step S2 shown in FIG. 15) for the substrate stage PST (substrate holder PH) and the measuring stage MST as follows during the period in which the substrate P is not exposed, for example, during the period after the exposure is completed for the substrate of a certain lot and until the exposure is started for the substrate of the next lot. In the cleaning step, at first, the dummy substrate CP described above is attracted and held on the substrate holder PH. In a state that the radiation of the exposure light EL is stopped, as shown in FIG. 4, the liquid 1 is supplied onto the dummy substrate CP from the liquid supply mechanism 10 (liquid supply sections 11, 12) to form the liquid immersion area AR2 on the dummy substrate CP; and the substrate stage PST and the measuring stage MST are moved along with the predetermined routes with respect to the liquid immersion area AR2 (flow passage-forming member 30) to clean the upper surface of the substrate holder PH on the substrate stage PST and the upper surface of the measuring table MTB of the measuring stage MST. In this procedure, for example, the liquid 1 of the liquid immersion area AR2 is recovered by the liquid recovery mechanism 20 (liquid recovery section 21) by approximately the same amount as the supply amount per unit time of the liquid 1 supplied by the liquid supply sections 11, 12. With this, the foreign matter, which remains on the substrate holder PH and the measuring table MTB, is allowed to enter into and mix with the liquid 1 to be recovered by the liquid recovery section 21, while maintaining the liquid immersion area AR2 to have a size in the desired state. The mask stage MST is made to stand still in the cleaning step. That is, the cleaning step is common to the exposure step in that the substrate stage PST is moved relative to the liquid immersion area AR2. However, the cleaning step is different from the exposure step in that the exposure light EL is not radiated and the mask stage MST is made to stand still.

Figure 7A:
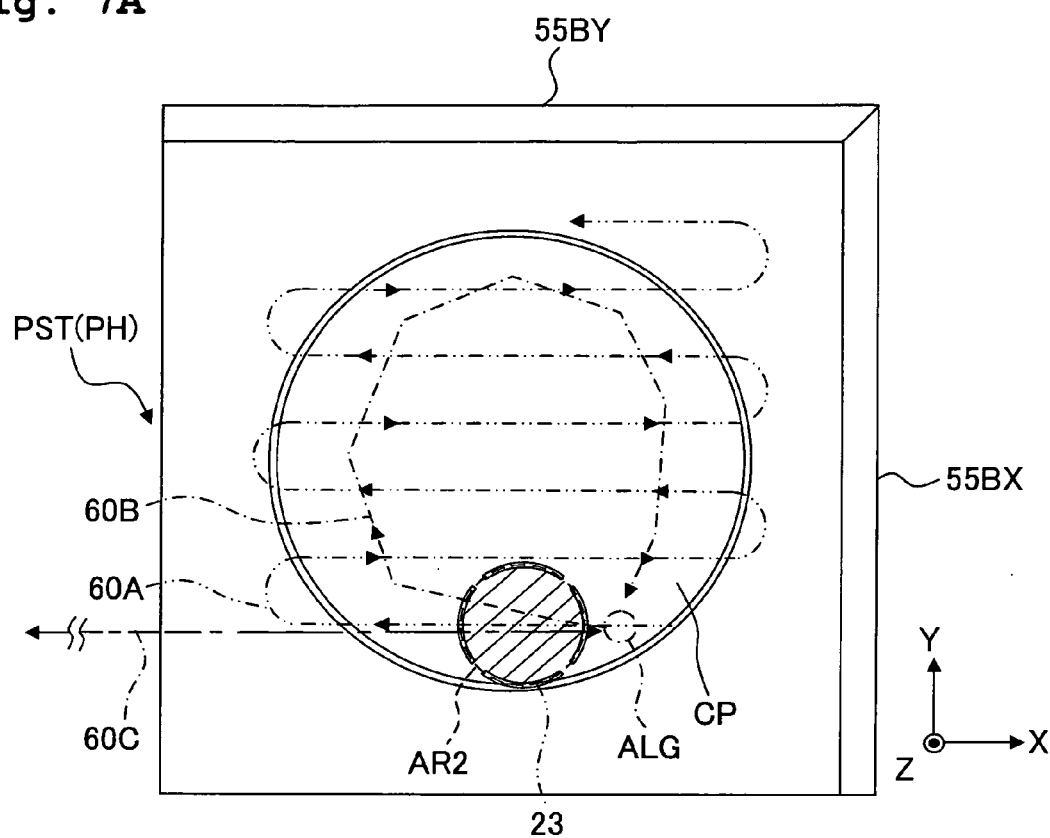
FIG. 7A is a plan view of a substrate stage PST (substrate holder PH) shown in FIG. 1 and a dummy substrate CP placed thereon and depicts the route of movement of the liquid immersion area.
Figure 7B:
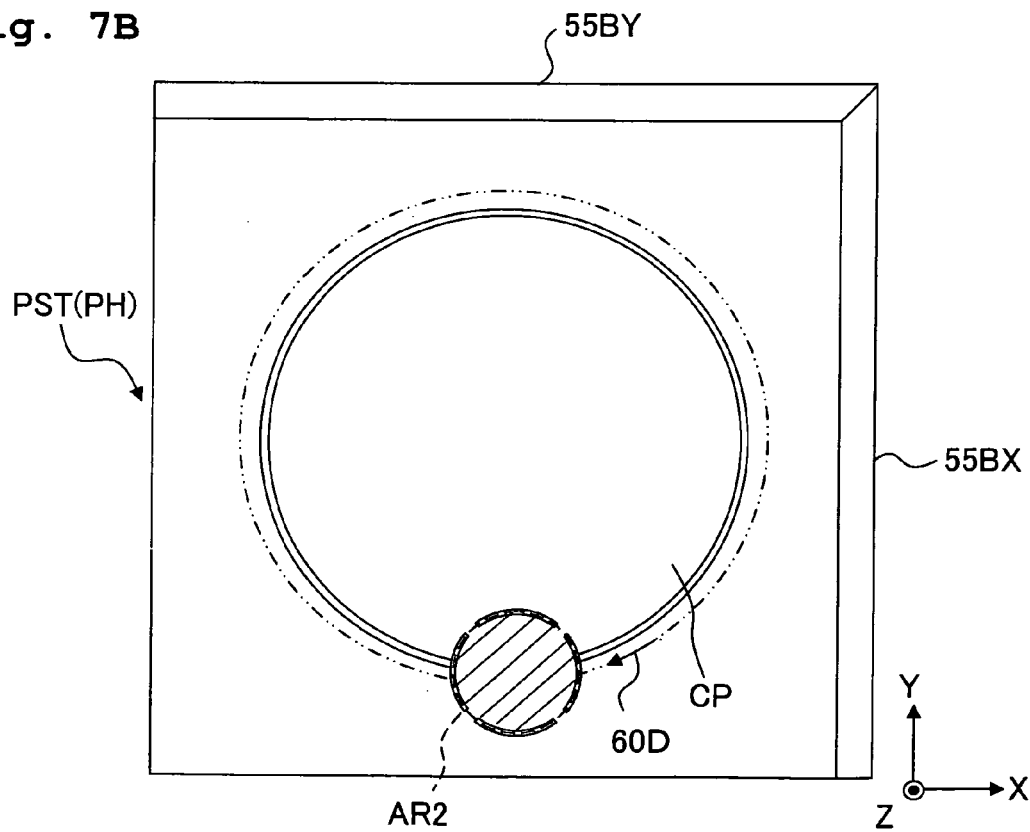
FIG. 7B is another route of movement of the liquid immersion area.

FIGS. 7A and 7B show examples of the movement route (movement locus) of the substrate stage PST with respect to the liquid immersion area AR2 during the cleaning of the substrate stage PST. In FIG. 7A, as an example, the substrate stage PST is moved so that the liquid immersion area AR2 is relatively moved, on the substrate holder PH of the substrate stage PST, along a route 60A on the entire surface of the dummy substrate CP in the same manner as in the ordinary scanning exposure on the substrate holder PH of the substrate stage PST. Note that in reality, the liquid immersion area AR2 is made to stand still, and the substrate stage PST is moved. However, for the convenience of the explanation, FIGS. 7A and 7B are depicted as if the liquid immersion area AR2 is moved on the substrate stage PST.

As another example, it is allowable to define the movement route of the substrate stage PST in the same manner as in a case that the alignment measurement is performed in accordance with the enhanced global alignment (EGA) system by the alignment sensor ALG (case that a plurality of alignment marks on the substrate P are detected by the alignment sensor ALG) as disclosed, for example, in Japanese Patent Application Laid-open No. 61-44429 (corresponding to U.S. Pat. No. 4,780,617). For example, as shown in FIG. 7A, the substrate stage PST may be moved at a high velocity so that the alignment sensor ALG is moved over or above the substrate P along with a route 60B. In a case that the substrate stage PST is moved at a high velocity with respect to the liquid immersion area AR2 and/or in a case that the substrate stage PST is moved in one direction over a long distance, the foreign matter sometimes easily remains on the substrate stage PST (plate portion 97 of the substrate holder PH). For example, in a case that the liquid immersion area AR2 is moved between the substrate stage PST and the measuring stage MST, if the liquid immersion area AR2 is moved along a route 60 C (see FIG. 7) on the substrate holder PH at a high velocity and continuously in the X direction over a long distance, then the foreign matter sometimes easily remains on the substrate holder PH along with the route 60C. Accordingly, in the cleaning step, the substrate stage PST may be moved with respect to the liquid immersion area AR2 so that the liquid immersion area AR2 is moved on the substrate holder PH along with the route 60C. With this, it is possible to clean (remove) the foreign matter remaining on the route 60C during the high velocity movement of the substrate stage PST. In the cleaning step, it is not necessarily indispensable that the substrate stage PST is moved along with all of the routes 60A to 60C described above. It is also allowable that the substrate stage PST is moved along with only a part of the routes, if necessary.

The substrate stage PST may be moved so that the liquid immersion area AR2 is relatively moved along with a route in which the liquid immersion area AR2 is not moved on the substrate stage PST during the ordinary exposure, i.e., along with a route in which at least a part of the route is different from the movement route of the liquid immersion area AR2 on the substrate stage PST during the exposure. For example, the exfoliation of the resist easily occurs at the edge portion of the substrate P as the exposure objective, and the foreign matter easily adheres to the substrate stage PST (substrate holder PH) in the vicinity of the edge of the substrate P. In the case of the scanning exposure for a shot area located in the vicinity of the edge of the substrate P, the liquid immersion area AR is moved while a part thereof protrudes to the outside of the substrate P. Therefore, there is also such a possibility that the foreign matter might be deposited on the upper surface of the substrate stage PST (plate portion 97). Therefore, in the cleaning step, the movement route of the substrate stage PST during the cleaning may be determined so that the liquid immersion area AR2 is moved along with the edge of the dummy substrate CP. FIG. 7B is such a movement route 60D. The movement route 60D circles around at the outside of the circumferential edge of the dummy substrate CP. Owing to the movement route 60D as described above, the foreign matter, adhering to the vicinity of the edge of the substrate P on the substrate stage PST (substrate holder PH), is effectively removed. In this case, the movement routes 60A, 60B and/or the movement route 60C as shown in FIG. 7A may be added, in addition to the movement route 60D. By doing so, the movement route of the liquid immersion area AR2 in the cleaning step completely includes the movement route of the liquid immersion area AR2 in the exposure step, and thus more effective cleaning can be expected. The movement-route of the substrate stage PST may be determined so that the liquid immersion area AR2 is formed in an area, of the surface of the substrate stage PST (plate portion 97 of the substrate holder PH), which does not make contact with the liquid 1 in the ordinary operation. Accordingly, it is possible to clean off the foreign matter adhered to various locations on the substrate stage PST. In this case, the movement route of the substrate stage PST may be determined so that the liquid immersion area AR2 is relatively moved only in the area which does not make contact with the liquid 1. Alternatively, the movement route of the substrate stage PST may be determined so that the liquid immersion area AR2 is relatively moved in a range or area (including the area which does not make contact with the liquid 1) which is greater than the movement range of the liquid immersion area AR2 on the substrate stage PST in the ordinary operation.

In the cleaning step as described above, as shown in FIG. 6, the liquid 1 is sucked also by the sucking device 50 on the side of the substrate holder PH. The dummy substrate CP of this embodiment has the end portion CPc which is liquid-attractive. Therefore, in such a state that the liquid immersion area AR2 passes across the boundary portion between the dummy substrate CP and the plate portion 97 of the substrate holder PH, the liquid 1, into which the foreign matter enters and mixed therewith, is allowed to inflow from the end portion CPc of the dummy substrate CP into the recesses 97a, 97b. The inflowed liquid 1 is sucked from the recovery port 51 into the sucking device 50, and the liquid 1 is discharged from the substrate holder PH. Therefore, the minute foreign matter such as the particles, which entered into and mixed with the liquid 1, is also discharged simultaneously with the liquid 1. Further, in a case that the liquid-attractive grooves CPn are formed at the upper surface portion CP of the dummy substrate CP, a part of the particles or the like, which entered into and mixed with the liquid 1 from the plate portion 97, is captured by the grooves CPn. It is also allowable that the sucking device 50 is omitted. For example, in a case that the end portion CPc of the dummy substrate CP is also made to be liquid-repellent, it is also allowable that the sucking device 50 is not provided, because it is possible to suppress the inflow of the liquid 1 into the recess 97a.

Figure 8B:
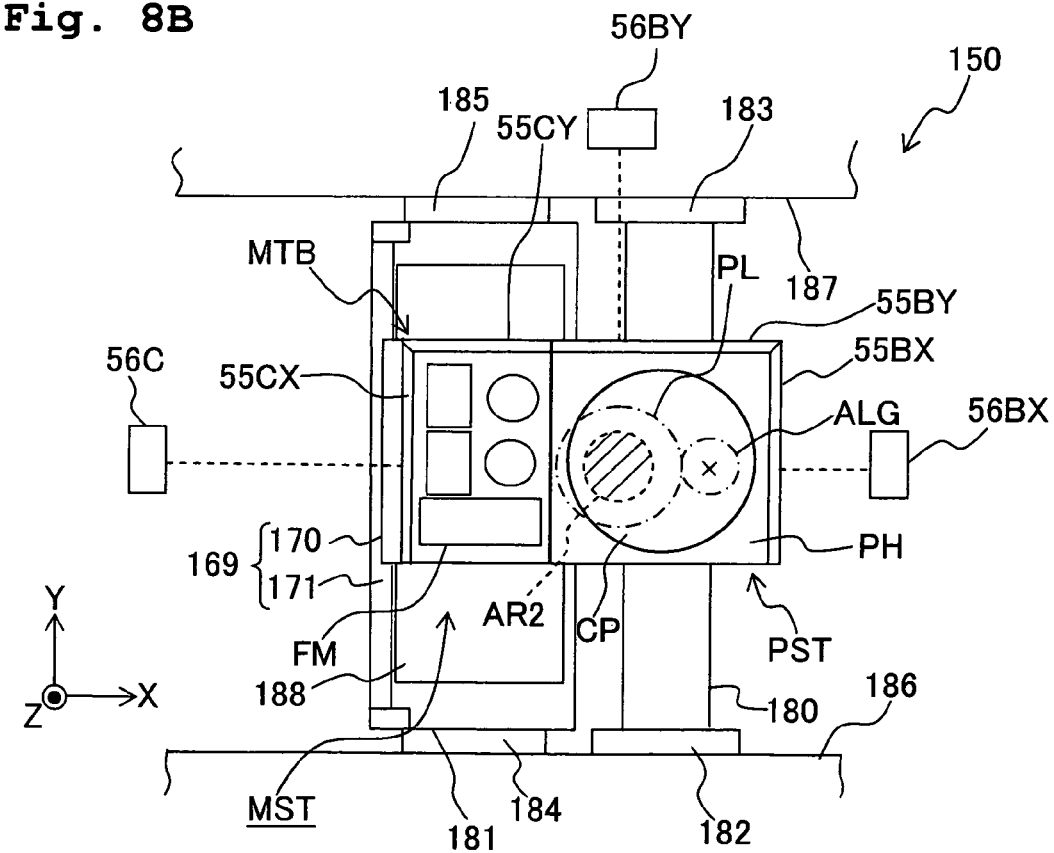
FIG. 8B is a plan view of a state that the substrate holder PH on the measuring stage MST and a measuring table MTB of the measuring stage MST are allowed to make tight contact with each other.
Figure 9A:
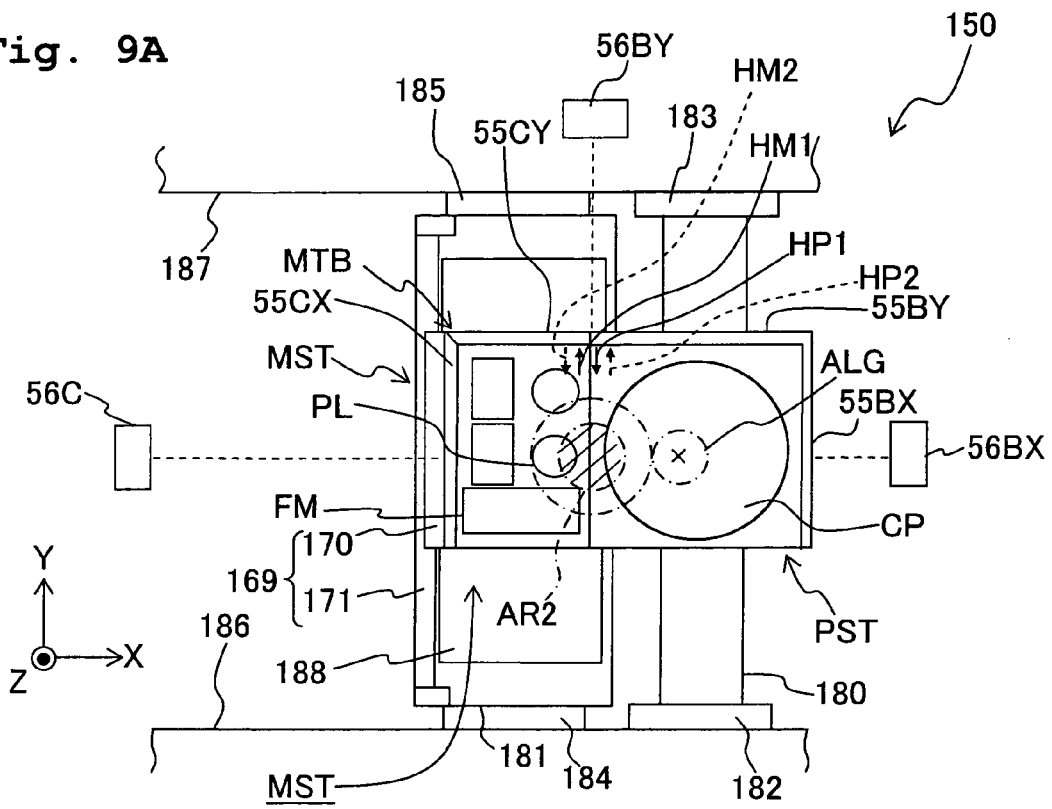
FIG. 9A is a plan view of a situation in which the liquid immersion area AR2 is relatively moved from the surface of the substrate holder PH to the surface of the measuring table MTB.
Figure 9B:
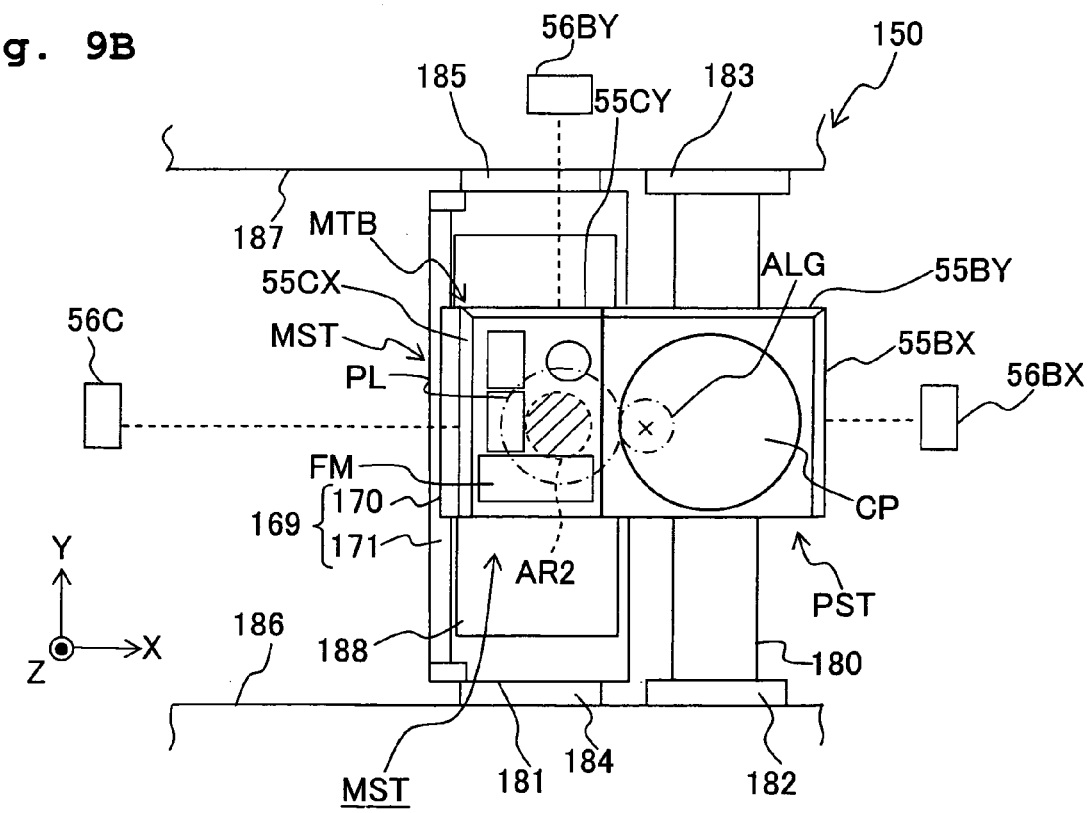
FIG. 9B is a plan view of a situation in which the liquid immersion area AR2 is relatively moved on the measuring table MTB.

Subsequently, the controller CONT performs the cleaning of the measuring stage MST (Step S3 shown in FIG. 15). Upon cleaning the measuring stage MST, the controller CONT allows the measuring table MTB of the measuring stage MST to make tight contact with (or approach closely to) the substrate holder PH on the substrate stage PST, as shown in FIG. 8B. Subsequently, as shown in FIG. 9A, the controller CONT simultaneously moves the substrate stage PST and the measuring table MTB (measuring stage MST) in the +X direction with respect to the liquid immersion area AR2 to move the liquid immersion area AR2 from the substrate stage PST to the measuring table MTB as shown in FIG. 9B. After that, for example, the measuring stage MST is moved so that the liquid immersion area AR2 is relatively moved on the entire upper surface of the measuring table MTB, thereby making it also possible to clean off the foreign matter adhered onto the measuring table MTB. In this embodiment, the movement route of the measuring stage MST is determined so that the liquid immersion area AR2 is relatively moved on the entire upper surface of the measuring table MTB. However, the movement route of the measuring stage MST may be determined so that the liquid immersion area AR2 is relatively moved only on a part of the upper surface of the measuring table MTB.

The operation, advantage, and modified embodiments of the exposure apparatus EX of the first embodiment are summarized below. A1: The foreign matter, which is adhered to the substrate holder PH on the substrate stage PST, can be removed to execute the maintenance of the exposure apparatus for the liquid immersion exposure by performing the cleaning step of this embodiment as described above. Therefore, upon thereafter exchanging the dummy substrate CP on the substrate holder PH with the substrate P as the exposure objective to perform the exposure by the liquid immersion method, the amount of the foreign matter entered into and mixed with the liquid 1 of the liquid immersion area AR2 is decreased, and thus the defect of the pattern to be transferred is reduced. This improves the yield of the semiconductor device or the like to be produced.

A2: In the cleaning step, the liquid 1, which is the same as that used during the exposure, is used as the cleaning liquid supplied to form the liquid immersion area AR2 in this embodiment. Therefore, it is advantageous that any special new equipment is not required. Further, it is unnecessary to clean the flow passage of the flow passage-forming member 30, etc.; and the exposure operation can be started immediately after the cleaning operation. However, it is also allowable to use, as the cleaning liquid, for example, an organic solvent such as thinner or a mixture liquid obtained by mixing such an organic solvent and the liquid 1 used during the exposure. By doing so, it is possible to enhance the cleaning effect. In the latter case, it is also allowable to supply the organic solvent and the liquid 1 for the exposure to the liquid immersion area AR2 via different flow passages.

A3: The substrate stage PST (substrate holder PH) of this embodiment has the holding portion PH1 for attracting and holding the substrate P, and the dummy substrate CP is attracted and held on the holding portion PH1 in the cleaning step. Therefore, it is possible to prevent the cleaning liquid from being erroneously sucked by the vacuum system 40 of the holding portion PH1. Further, the holding portion PH1 (for example, the support portion 46) is not wetted with the cleaning liquid as well. A4: In a case that the upper surface portion CPa of the dummy substrate CP is liquid-repellent and the plurality of liquid-attractive grooves CPn are formed at the upper surface portion, the minute foreign matter such as particles can be captured in the grooves CPn. Therefore, the substrate holder PH can be cleaned more efficiently. Therefore, the dummy substrate CP may be exchanged with any other unused dummy substrate during the cleaning step.

In the cleaning step, for example, an unexposed substrate, which is not coated with the resist or the like, may be held on the holding portion PH1. The liquid immersion area AR2 and the substrate stage PST may be relatively moved with each other so that the liquid immersion area AR2 is moved only on the dummy substrate CP (substrate not coated with the resist) in the cleaning step. By moving the liquid immersion area AR2 only on the clean dummy substrate CP, it is possible to clean the flow passage-forming member 30 (especially the lower surface which makes contact with the liquid 1). In particular, in a case that the substrate stage PST (substrate holder PH) is not contaminated or dirtied and only the flow passage-forming member 30 is contaminated, it is possible to execute the cleaning of the flow passage-forming member 30 by moving the liquid immersion area AR2 on only the dummy substrate CP, without contaminating or polluting the substrate stage PST (substrate holder PH). In this case, the cleaning objective is not limited to the flow passage-forming member 30; and it is also allowable to clean any other liquid contact member (for example, the optical element 2) which makes contact with the liquid 1 of the liquid immersion area AR2.

Second Embodiment

An exposure apparatus EX' according to a second embodiment of the present invention will be explained with reference to FIGS. 10 to 13. In the following description, the constitutive parts or components, which are the same as or equivalent to those of the first embodiment, are designated by the same reference numerals, and any explanation therefor will be simplified or omitted. In the exposure apparatus EX' of the second embodiment shown in FIG. 10, a liquid supply mechanism 10' supplies the liquid 1 onto the substrate P and onto the measuring stage MST in the exposure step, and the liquid supply mechanism 10' supplies a cleaning liquid 1A onto the substrate P and onto the measuring stage MST in the cleaning step. The exposure apparatus EX' of the second embodiment is provided with a stage side liquid supply mechanism 118 (see FIG. 12) which blows a cleaning liquid 1B against the liquid supply port of the liquid supply mechanism 10' from the side of the substrate stage PST.

The liquid supply mechanism 10' supplies the certain liquid 1 or the cleaning liquid 1A onto the substrate P. The liquid supply mechanism 10' includes the first liquid supply section 11 and the second liquid supply section 12 which are capable of feeding the liquid 1; a third liquid supply section 111 and a fourth liquid supply section 121 which are capable of feeding a certain solvent (for example, thinner, γ-butyrolactone, etc.); a first supply tube 11A to which supply tubes from the first and third liquid supply sections 11, 111 are combined; a second supply tube 12A to which supply tubes from the second and fourth liquid supply sections 12, 121 are combined; valves 11B, 11C which individually open/close the supply tubes from the first and third liquid supply sections 11, 111; and valves 12B, 12C which individually open/close the supply tubes from the second and fourth liquid supply sections 12, 121. Each of the first and second liquid supply sections 11, 12 and the third and fourth liquid supply sections 111, 121 is provided with a tank for accommodating the liquid 1 or the solvent, a filter section, a pressurizing pump, etc., and is controlled by the controller CONT. The opening/closing operations of the valves 11B, 11C, 12B and 12C are also controlled by the controller CONT. A part or parts of the liquid supply mechanism 10' may be substituted with, for example, the equipment of the factory or the like in which the exposure apparatus EX' is installed.

Upon exposing the substrate P in accordance with the liquid immersion method in the exposure apparatus EX', the valves 11B, 12B are opened, and the valves 11C, 12C are closed so that the liquid 1 is supplied from the liquid supply sections 11, 12 to the liquid immersion area AR2. On the other hand, upon cleaning the substrate stage PST or the measuring stage MST, etc. as described later on, the opening/closing amounts of the valves 11B, 12B and the valves 11C, 12C are controlled so that the cleaning liquid 1A (liquid for the cleaning), which is obtained by mixing the liquid 1 and the certain solvent at a predetermined ratio, is supplied to the liquid immersion area AR2. When the liquid 1 is water, and the solvent is thinner, then a mixture liquid of the liquid 1 and thinner can be used as the cleaning liquid 1A. On the other hand, when the solvent is γ-butyrolactone, the solvent itself may be used as the cleaning liquid 1A. The mixing ratio of the liquid 1 and the solvent is set by the controller CONT.

The liquid recovery mechanism 20 recovers the liquid 1 or the cleaning liquid 1A supplied onto the substrate P (or the cleaning liquid 1B fed from the stage side liquid supply mechanism 118 shown in FIG. 12 as described later on).

The controller CONT is capable of independently controlling the supply amounts of the liquids (liquid 1 or the cleaning liquid 1A) per unit time with respect to the substrate P, etc. to be supplied respectively by the first and second liquid supply sections 11, 12 and the third and fourth liquid supply sections 111, 121 in the same manner as in the first embodiment. The liquid 1 or the cleaning liquid 1A, which is fed from the liquid supply sections 11, 111 or the liquid supply sections 12, 121, is supplied onto the substrate P from the supply ports 13, 14 (see FIG. 3) provided on the lower surface of the flow passage-forming member 30 (first member 31) to be opposite to the substrate P, via the supply tubes 11A, 12A and the supply flow passages 82A, 82B of the flow passage-forming member 30.

The liquid recovery operation of the liquid recovery section 21 is controlled by the controller CONT. The controller CONT is capable of controlling the recovery amount of the liquid 1 or the cleaning liquid 1A per unit time to be recovered by the liquid recovery section 21. For example, the liquid 1 or the cleaning liquid 1A on the substrate P, which is recovered from the recovery ports 23 provided on the lower surface of the flow passage-forming member 30 (first member 31) to be opposite to the substrate P, is recovered by the liquid recovery section 21 via the recovery tube 84 of the flow passage-forming member 30 and the recovery tube 22. The flow passage-forming member 30 is same as or equivalent to that used in the first embodiment explained with reference to FIG. 3.

Figure 10:
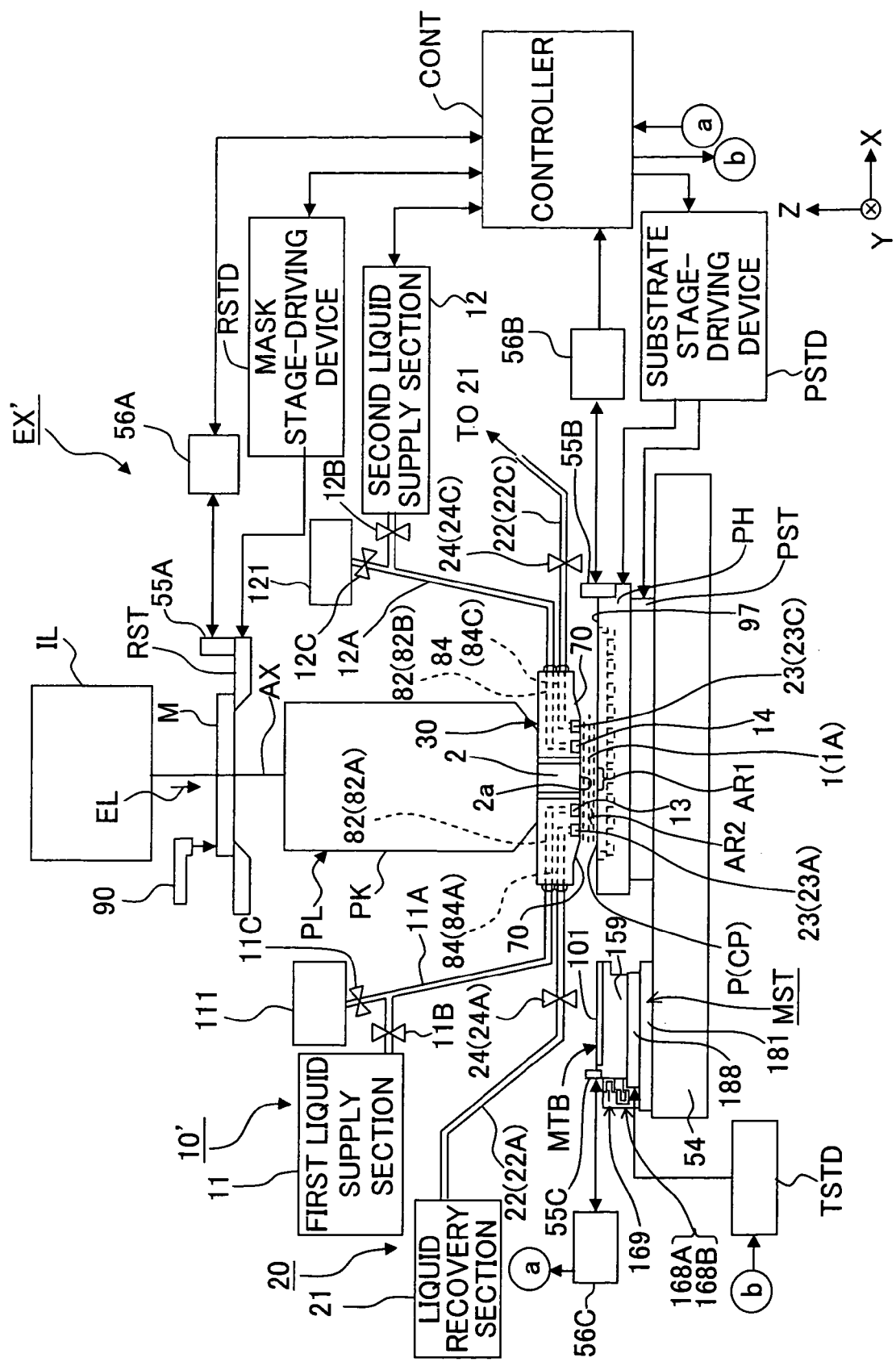
FIG. 10 is a schematic construction of an exposure apparatus according to a second embodiment of the present invention.
Figure 11:
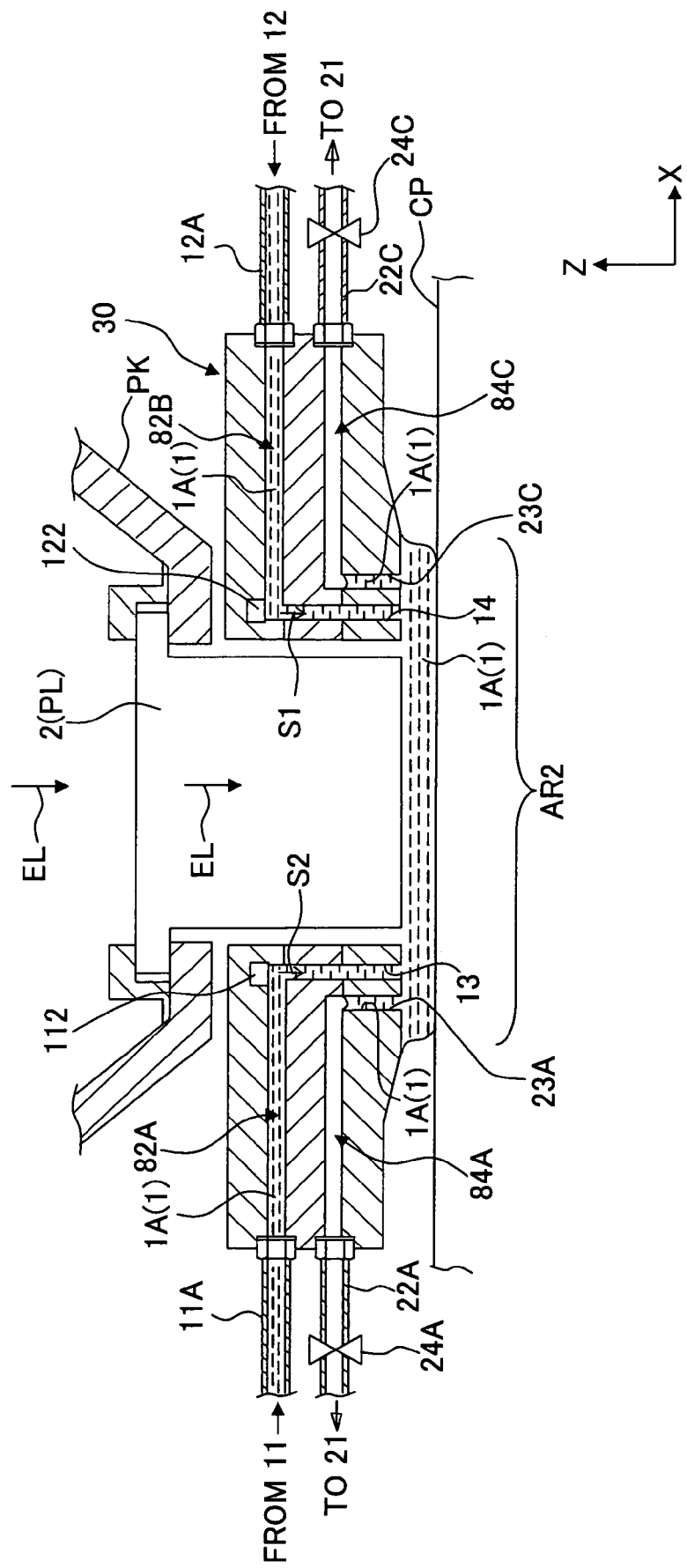
FIG. 11 is a perspective view of a flow passage-forming member 30 shown in FIG. 10.

FIG. 11 is a sectional view taken along a line IV-IV shown in FIG. 2 illustrating the flow passage-forming member 30 used in this embodiment. As shown in FIG. 11, ultrasonic vibrators 112, 122, each of which is constructed of, for example, a piezoelectric ceramics (for example, those based on barium titanate or lead titanate zirconate (so-called PZT)) or a ferrite vibrator (magnetostrictive vibrator), are provided at portions of the supply flow passages 82A, 82B opposite to the supply ports 13, 14 respectively. If necessary, ultrasonic waves S2, S1, which are, for example, at about 100 kHz to 1 MHz, are generated by the ultrasonic vibrators 112, 122 toward the supply ports 13, 14 under the control of the controller CONT shown in FIG. 10 during the period in which the cleaning liquid 1A is supplied to the liquid immersion area AR2 in the cleaning step. Accordingly, it is possible to improve the cleaning effect brought about when the cleaning is performed with the cleaning liquid 1A. In this embodiment, the ultrasonic vibrators 112, 122 are provided at intermediate positions of the flow passage-forming member 30, i.e., of the supply flow passages for the liquid 1. However, there is no limitation to this. The ultrasonic vibrators 112, 122 may be provided at other positions.

The substrate holder PH, which is same as or equivalent to that of the first embodiment, is also used in this embodiment. However, as the dummy substrate CP, a liquid-attractive substrate, for example, a silicon substrate, which has relatively high affinity for the cleaning liquid 1A, is used. The liquid-repelling process is performed to the upper surface portion CPa except for the end portion (side surface and circumferential edge portion of upper surface) CPc of the dummy substrate CP in order to repel the cleaning liquid A1. That is, the dummy substrate CP, which is same as that of the first embodiment, is also used in this embodiment.

Figure 12:
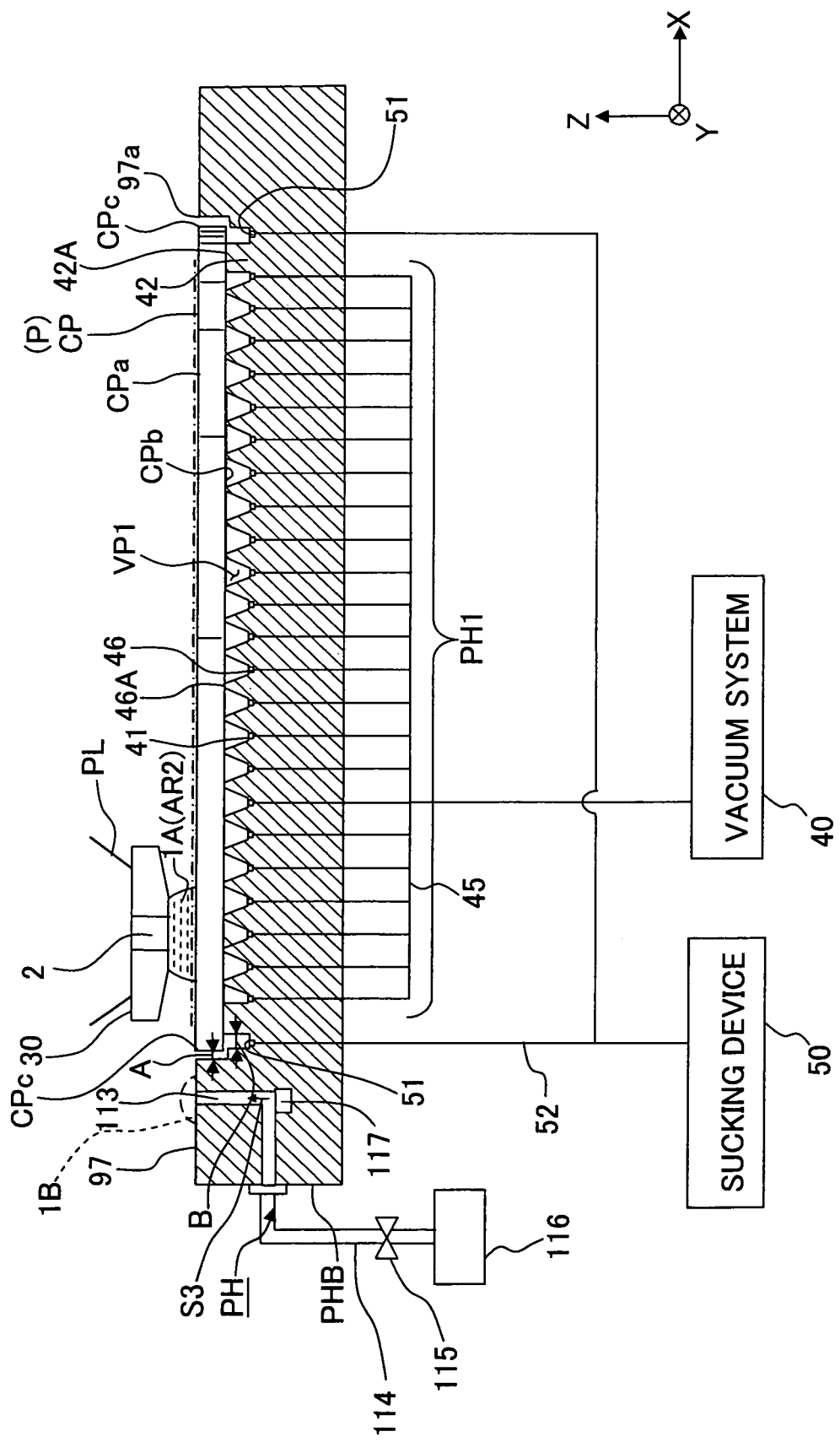
FIG. 12 is a sectional view of an attracting mechanism and a sucking mechanism of a substrate holder PH shown in FIG. 10.
Figure 13:
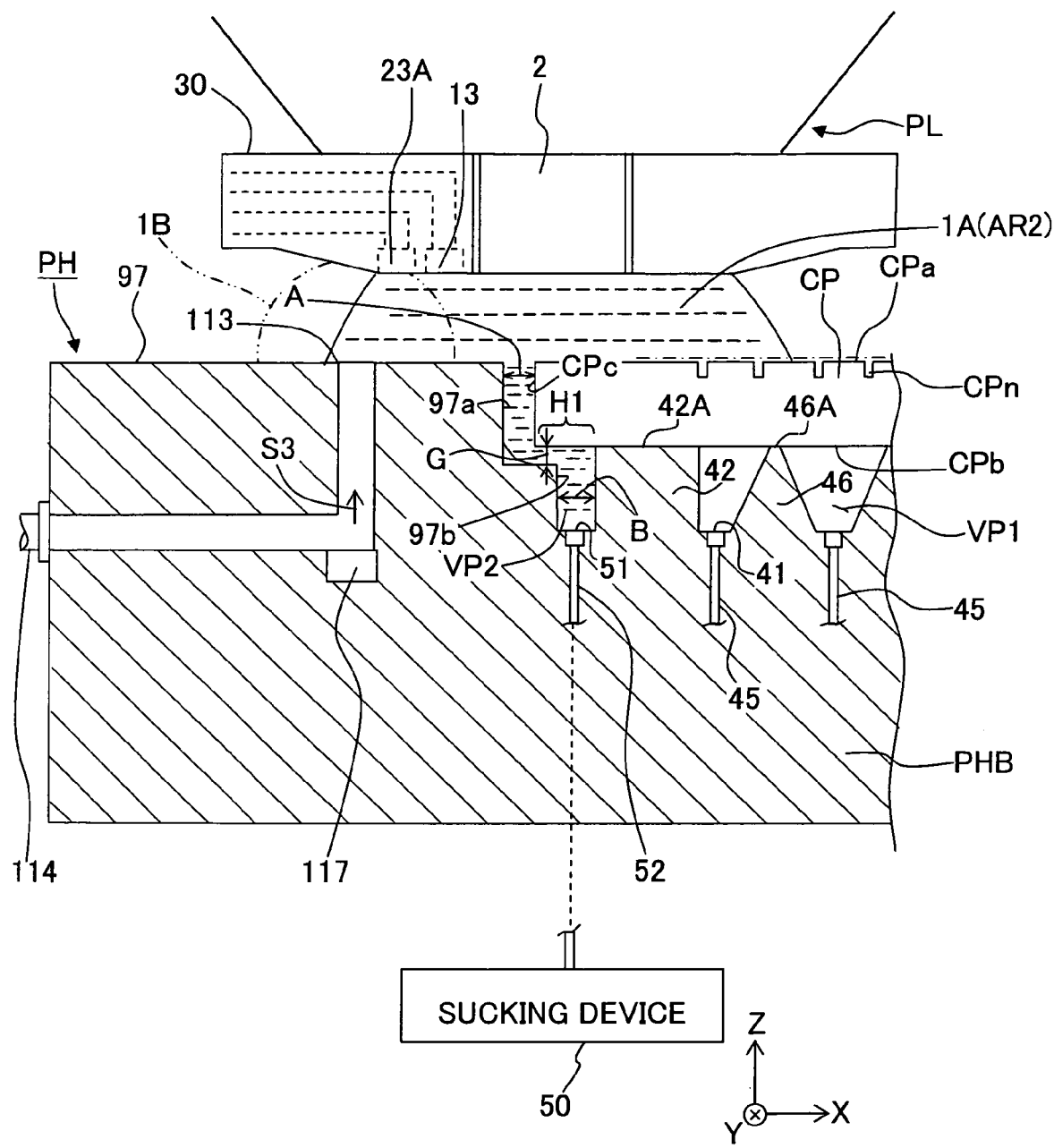
FIG. 13 is a magnified view of main components shown in FIG. 12.

FIGS. 12 and 13 show a sucking mechanism and a attracting mechanism for the substrate holder PH used in the second embodiment. The sucking operation is performed by the sucking device 50 via the recovery port 51 to negatively pressurize the second space VP2. By doing so, when the boundary portion between the dummy substrate CP and the plate portion 97 passes across the liquid immersion area AR2, it is possible to discharge the cleaning liquid 1A, inflowing into the second space VP2 via the gap A and the gap G, to the outside of the substrate holder PH from the bottom surface side of the dummy substrate CP. In this procedure, the back surface CPb of the dummy substrate CP makes tight contact with the upper surface 42A of the circumferential wall portion 42 shown in FIG. 13 by the vacuum system 40 shown in FIG. 12. Therefore, the cleaning liquid 1A does not inflow into the first space VP1 on the back surface of the dummy substrate CP from the second space VP2, and thus any erroneous operation of the vacuum system 40 etc. can be avoided. The liquid-repelling process is performed to at least a part of the substrate holder PH. The substrate holder PH has the liquid repellence with respect to the liquid 1 and the cleaning liquid 1A.

With reference to FIG. 13, a nozzle portion 113, which is provided to jet (supply) the cleaning liquid 1B, is embedded in an upper portion of the plate portion 97 in the base member PHB of the substrate holder PH. The nozzle portion 113 is connected to a fifth liquid supply section 116 which supplies the solvent (for example, thinner having a predetermined concentration or γ-butyrolactone) that is same as or equivalent to that of the third liquid supply section 111 shown in FIG. 10, via a flexible piping 114 connected to the substrate holder PH. A valve 115 is provided on the piping 114. Further, an ultrasonic vibrator 117, which is same as or equivalent to the ultrasonic vibrator 112 shown in FIG. 12, is fixed to a portion opposite to or facing the jetting port in the nozzle portion 113. The ultrasonic vibrator 117 is capable of generating an ultrasonic wave S3 at about 100 kHz to 1 MHz toward the jetting port of the nozzle portion 113. The operations of the fifth liquid supply section 116, the ultrasonic vibrator 117, and the valve 115 are also controlled by the controller CONT shown in FIG. 10. The stage side liquid supply mechanism 118 is constructed by the nozzle portion 113, the piping 114, the valve 115, the ultrasonic vibrator 117, and the fifth liquid supply section 116.

In the second embodiment, the solvent from the fifth liquid supply section 116 is blown in the cleaning step as the cleaning liquid 1B from the nozzle portion 113 against the liquid supply ports 13, 14 of the liquid supply mechanism 10 shown in FIG. 3. Accordingly, it is possible to clean off the foreign matter adhered to the supply ports 13, 14. In this procedure, the supplied cleaning liquid 1B can be recovered to the liquid recovery mechanism 20 shown in FIG. 10 from the recovery ports 23A to 23D. By operating the ultrasonic vibrator 117 during the cleaning, the supply ports 13, 14 can be ultrasonically cleaned, thereby making it possible to enhance the cleaning effect. It is also allowable to clean not only the supply ports but also other portions of the flow passage-forming member 30 (for example, recovery ports) or the optical element 2.

Exposure Step

Figure 16:
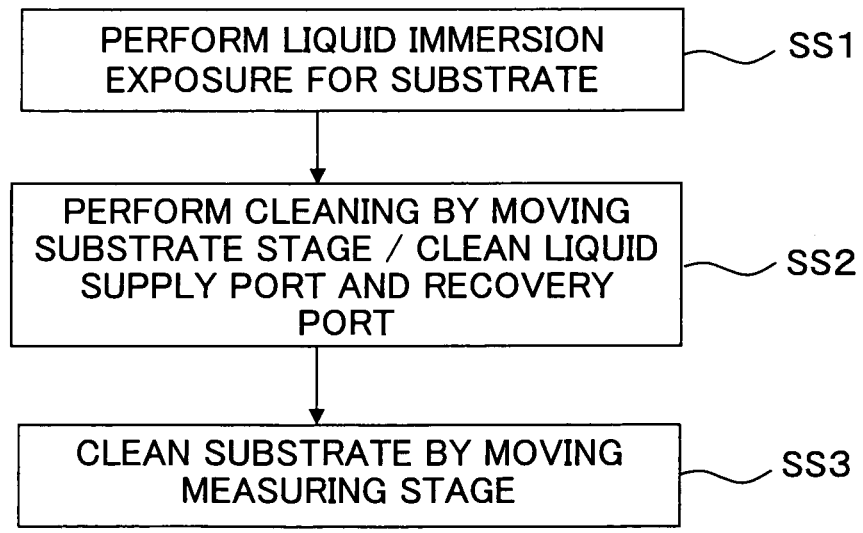
FIG. 16 is a flow chart of a specific example of the exposure method according to the second embodiment of the present invention.

An explanation will be made below with reference to a flow chart shown in FIG. 16 about the exposure method using the exposure apparatus EX' according to the second embodiment. The exposure apparatus EX' according to the second embodiment is also provided with a measuring stage same as the measuring stage shown in FIGS. 8 and 9. However, for the explanation of the measuring stage, see the explanation in the first embodiment. At first, the liquid immersion exposure is performed for the substrate P in the same manner as in the first embodiment by using the exposure apparatus EX' (Step SS1 shown in FIG. 16).

First Cleaning Step

The exposure apparatus EX' executes the cleaning step for the substrate stage PST (substrate holder PH) and the measuring stage MST as follows during the period in which the substrate P is not exposed, for example, after the exposure is completed for the substrate of a certain lot and until the exposure is started for the substrate of the next lot. In the cleaning step, at first, the dummy substrate CP is suction-attracted and held on the substrate holder PH. As shown in FIG. 11, the cleaning liquid 1A is supplied onto the dummy substrate CP from the liquid supply sections 11, 111, 12, 121 of the liquid supply mechanism 10' shown in FIG. 10 to form the liquid immersion area AR2 on the dummy substrate CP in a state that the radiation of the exposure light EL is stopped. The substrate stage PST and the measuring stage MST are moved along the predetermined route with respect to the liquid immersion area AR2 (flow passage-forming member 30) to clean the upper surface of the substrate holder PH on the substrate stage PST and the upper surface of the measuring table MTB of the measuring stage MST (Steps SS2, SS3 shown in FIG. 16). In this procedure, as an example, the cleaning liquid 1A of the liquid immersion area AR2 is recovered by the liquid recovery mechanism 20 (liquid recovery section 21) by an amount approximately same as the supply amount per unit time of the cleaning liquid 1A supplied by the liquid supply sections 11, 111, 12, 121. By doing so, any foreign matter, remaining on the substrate holder PH and the measuring table, is allowed to enter into and mix with the cleaning liquid 1A, and is recovered by the liquid recovery section 21, while maintaining the size of the liquid immersion area AR2 to be in the desired state. In this procedure, when it is desired to enhance the cleaning effect, the ultrasonic wave may be outputted into the cleaning liquid 1A by driving the ultrasonic vibrators 112, 122 shown in FIG. 11.

As another method to enhance the cleaning effect, it is also allowable that, when the substrate holder PH is cleaned by using the cleaning liquid 1A, the Z stage portion of the substrate stage PST shown in FIG. 10 is driven to vibrate the substrate holder PH in the Z direction at a minute amplitude. With this, the effect to exfoliate or remove the foreign matter from the upper portion of the substrate holder PH is improved in some cases. As still another method to enhance the cleaning effect, it is also allowable that, with reference to FIG. 11, the exposure light EL is radiated when the cleaning is performed by using the cleaning liquid 1A. The exposure light EL of this embodiment is the ultraviolet pulsed light beam. Therefore, the exposure light EL has the optical cleaning function to decompose organic matters, etc. Accordingly, when the optical cleaning function is added by the exposure light EL, the cleaning efficiency is improved in some cases. In the cleaning of the measuring stage MST also, the measuring table MTB may be vibrated in the Z direction, and the optical cleaning by the exposure light EL may be used in combination.

Second Cleaning Step

Next, an explanation will be made about the method for cleaning the liquid supply ports 13, 14 (supply nozzles) shown in FIG. 3. In order to clean the supply ports 13, 14 (supply nozzles), the nozzle portion 113 of the stage side liquid supply mechanism 118 provided for the substrate holder PH is moved by moving the substrate stage to the position under or below the liquid supply port 13 of the flow passage-forming member 30 as shown in FIG. 13 in a state that the supply operation for supplying the liquid 1 or the cleaning liquid 1A by the liquid supply mechanism 10 is stopped; and the cleaning liquid 1B is blown from the nozzle portion 113 against the side of the flow passage-forming member 30 as shown by a two-dot chain line. Subsequently, the cleaning liquid 1B is blown upwardly from the nozzle portion 113, while moving the nozzle portion 113 by moving the substrate stage to the position under or below the supply port 14; and the cleaning liquid 1B is recovered by the liquid recovery mechanism 20 shown in FIG. 10. Accordingly, it is possible to remove the foreign matter adhered to the vicinity of the supply ports 13, 14 and the recovery ports 23A to 23D (Step SS2 shown in FIG. 16). In this procedure, by operating the ultrasonic vibrator 117 shown in FIG. 13 to use the ultrasonic cleaning in combination, it is possible to enhance the cleaning effect.

The operation and the advantage of the exposure apparatus EX' of the second embodiment are summarized below. B1: The foreign matter, which adheres to the bottom surface of the flow passage-forming member 30 including, for example, the supply ports 13, 14 and the substrate holder PH on the substrate stage PST, can be dissolved in the solvent and removed with ease by performing the cleaning step using the cleaning liquid 1A or 1B described above. Therefore, upon thereafter exchanging the dummy substrate CP on the substrate holder PH with the substrate P as the exposure objective to perform the exposure by the liquid immersion method, the amount of the foreign matter entered into and mixed with the liquid 1 of the liquid immersion area AR2 is decreased, and thus the defect in the pattern transferred is reduced. Therefore, the yield of the semiconductor device or the like to be produced is improved.

B2: In the second embodiment, the substrate stage PST (substrate holder PH) has the holding portion PH1 for suction-attracting and holding the substrate P. In the cleaning step, the dummy substrate CP is suction-attracted and held on the holding portion PH1. Therefore, it is possible to prevent the cleaning liquid 1A from being erroneously sucked by the vacuum system 40 of the holding portion PH1. Further, the holding portion PH1 is not wetted with the cleaning liquid 1A as well.

B3: The portion of the dummy substrate CP except for the edge portion (end portion CPc) of the upper surface is liquid-repellent. In the cleaning step, the cleaning liquid 1A which travels along the edge portion to flow to the back surface side of the dummy substrate CP, is recovered from the side of the substrate holder PH. Therefore, the entire surface of the substrate holder PH can be cleaned more efficiently.

In the cleaning step, an unexposed substrate etc., which is not coated with, for example, the resist, may be held on the holding portion PH1 in the same manner as in the first embodiment. In the cleaning step, the liquid immersion area AR2 and the substrate stage PST may be moved relative to each other so that the liquid immersion area AR2 is moved only on the dummy substrate CP (substrate not coated with the resist). By moving the liquid immersion area AR2 only on the clean dummy substrate CP, it is possible to clean the flow passage-forming member 30 (especially the lower surface making contact with the liquid 1). In particular, when the substrate stage PST (substrate holder PH) is not contaminated or dirtied, and only the flow passage-forming member 30 is contaminated, then it is possible to execute the cleaning of the flow passage-forming member 30 by moving the liquid immersion area AR2 only on the dummy substrate CP, without contaminating the substrate stage PST (substrate holder PH). In this case, the cleaning objective is not limited to the flow passage-forming member 30. It is also allowable to clean any other liquid contact member (for example, the optical element 2) which makes contact with the liquid 1 of the liquid immersion area AR2.

B4: In the cleaning step, by performing also an optical cleaning in which the exposure light EL is radiated onto the side of the substrate stage PST or the measuring stage MST directly or via the projection optical system PL, it is possible to enhance the cleaning effect. The optical cleaning can be also used in the first embodiment.

B5: In the first cleaning step, by vibrating the upper surface of the substrate stage PST (and/or the measuring stage MST) in the optical axis direction of the projection optical system PL, it is possible to enhance the cleaning effect.

B6: In the cleaning step also, by adding the ultrasonic cleaning in which the cleaning liquid 1A or 1B is vibrated by the ultrasonic wave, it is also possible to enhance the cleaning effect. With reference to FIG. 11, the ultrasonic cleaning may be performed by the ultrasonic vibrators 112, 122 in a state that the liquid 1 same as that used during the exposure is supplied to the liquid immersion area AR2. Similarly, with reference to FIG. 13, the ultrasonic cleaning may be performed by the ultrasonic vibrator 117 in a state that the liquid 1 same as that used during the exposure is used as the cleaning liquid 1B. In these cases, no solvent is mixed in the cleaning liquid. However, the high cleaning effect is obtained by the ultrasonic cleaning.

B7 (A5): Further, in the cleaning step of the first and second embodiments, the upper surface of the measuring table MTB is also cleaned by moving the measuring stage MST with respect to the liquid immersion area AR2 as well. Therefore, it is possible to reduce the entering/mixing amount of the foreign matter into the liquid 1 of the liquid immersion area AR2, for example, during the measurement of the image formation characteristic of the projection optical system PL and the measurement of the baseline amount. By moving the liquid immersion area AR2 onto the substrate stage PST after the measuring operation performed with the measuring stage MST so as to expose the substrate P, it is also possible to reduce the foreign matter contained in the liquid 1 of the liquid immersion area AR2 formed on the substrate P.

B8: In the cleaning step described above, the cleaning liquid, which is supplied from the liquid supply mechanism 10 (liquid supply sections 11, 111, 12, 121), is recovered by the liquid recovery mechanism 20 (liquid recovery section 21) and the sucking device 50. Therefore, the foreign matter, which is removed together with the cleaning liquid 1A or 1B from on the substrate stage PST and the measuring stage MST, can be prevented from remaining on any other place.

In the second embodiment, the cleaning liquid is supplied to the liquid immersion area AR2 by the third and fourth liquid supply sections 111, 121, and the cleaning liquid is also supplied from the fifth liquid supply section 116. However, only the liquid 1 used for the liquid immersion exposure may be supplied to the liquid immersion area AR2, and the cleaning liquid may be supplied from only the fifth liquid supply section 116, without supplying the solvent by the third and the fourth liquid supply sections 111, 121. Alternatively, in the second embodiment, it is also allowable that the cleaning liquid is not supplied from the fifth liquid supply section 116. In the case of the former, the cleaning liquid (solvent) is not allowed to pass through the flow passage for the liquid 1 to be supplied to the liquid immersion area AR2. Therefore, it is unnecessary to clean the flow passage, and the exposure operation can be started immediately after the cleaning operation. In the second embodiment, the substrate stage PST is provided with the liquid supply mechanism 118. However, the liquid supply mechanism 118 may be provided on any other movable member (movable object) different from the substrate stage PST, for example, on the measuring stage MST. Further, a part or parts (for example, the fifth liquid supply section 116) of the liquid-supply mechanism 118 may be substituted with any other liquid supply mechanism (for example, 111). The members (112, 121, 117) for vibrating the cleaning liquids 1A, 1B (or the liquid 1) are not limited to the ultrasonic vibrators; and it is also allowable to use any other member.

Figure 14A:
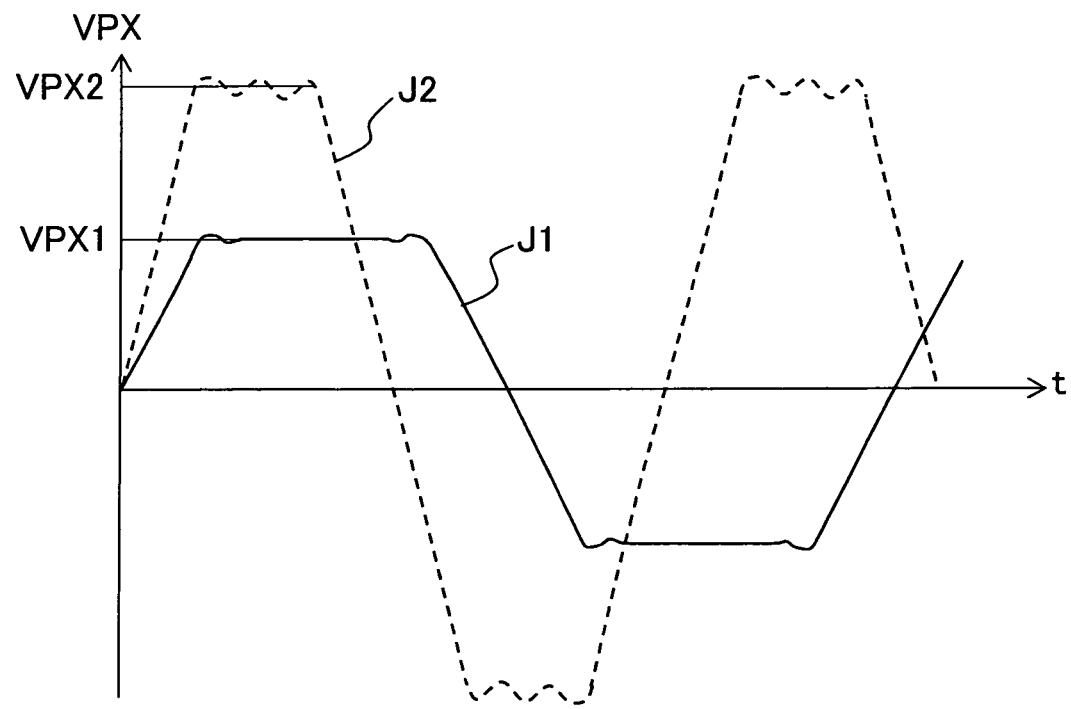
FIGS. 14A and 14B show an example of difference, between the exposure operation and the cleaning operation, in the velocity of movement of the substrate stage.
Figure 14B:
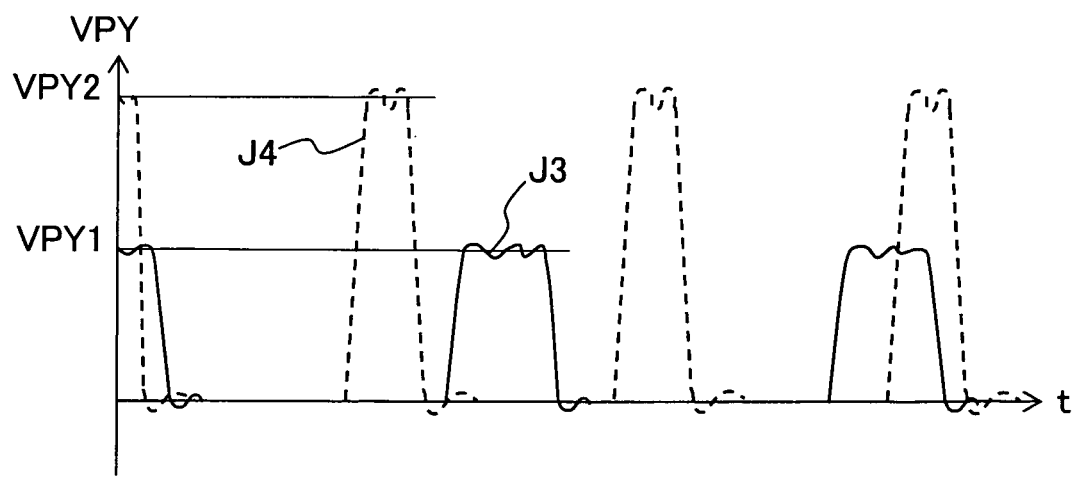

The cleaning steps of the first and second embodiments may be executed in the period in which the exposure step using the exposure apparatus EX, EX' shown in FIG. 1 is completed, for example, in the night. In this case, the following assumption is affirmed. That is, a solid curved line J1 shown in FIG. 14A indicates an example of the change of a movement velocity VPX in the X direction (scanning direction) of the substrate stage PST shown in FIG. 1 during the exposure step (during the scanning exposure) performed just before the cleaning step. A solid curved line J3 shown in FIG. 14B indicates an example of the change of a movement velocity VPY (movement velocity during the stepping movement) in the Y direction (non-scanning direction) of the substrate stage PST corresponding to the movement velocity VPX. FIGS. 14A and 14B exemplarily show the change of the movement velocity brought about when the image of the pattern of the mask M is successively subjected to the exposure while inverting the scanning direction for the plurality of shot areas arranged in the Y direction on the substrate P. In relation to the curved lines J1 and J2, the maximum values of the movement velocities VPX, VPY in the exposure step are approximately VPX1 and VPY1.

On the other hand, in the cleaning step executed, for example, in the night as described above, the dummy substrate CP shown in FIG. 5 is loaded on the substrate stage PST shown in FIG. 1 or 10, and the liquid 1 is supplied from the liquid supply mechanism 10 onto the dummy substrate CP and/or the plate portion 97 to form the liquid immersion area AR2. The substrate stage PST is moved in the X direction and the Y direction at a velocity higher than that adopted during the exposure performed just before the cleaning step, with respect to the liquid immersion area AR2 as indicated by the dotted curved line J2 shown in FIG. 14A and a dotted curved line J4 shown in FIG. 14B. The maximum values of the movement velocities VPX, VPY in the cleaning step are approximately VPX2 and VPY2 (see the curved lines J2, J4). The velocities are approximately twice the maximum values VPX1 and VPY1 brought about during the exposure. In this procedure, in order to maintain the synchronization accuracy between the mask stage RST and the substrate stage PST and drive the mask stage RST and the substrate stage PST stably at the predetermined velocities in the exposure step, the maximum value VPX1 of the movement velocity in the scanning direction of the substrate stage PST is set within a predetermined range. However, in the cleaning step, it is enough that only the substrate stage PST is driven in the state that the mask stage RST is allowed to stand still. Further, no problem arises even when the movement velocity in the scanning direction of the substrate stage PST is varied as indicated by the curved line J2. Therefore, the maximum values VPX2 and VPY2 of the movement velocities of the substrate stage PST during the cleaning can be easily raised to those approximate to the limits of the specification of the exposure apparatus. By driving the substrate stage PST in the cleaning step at a higher velocity than in the exposure step, it is possible in some cases to more reliably remove the foreign matter adhered to at least a part or parts of the portion (liquid contact portion) making contact with the liquid 1 including, for example, the upper surface of the substrate stage PST, the bottom surface of the flow passage-forming member 30, the liquid supply port, and the liquid recovery port. In this procedure, as an example, by operating the liquid recovery mechanism 20 shown in FIG. 1, the foreign matter can be recovered to the liquid recovery section 21 in a state that the foreign matter is made to enter into and mix with the liquid.

In the cleaning step, the substrate stage PST may be driven in the X direction and/or the Y direction at the acceleration greater than that brought about during the exposure, instead of the driving of the substrate stage PST at the velocity higher than that brought about during the exposure as described above, or in combination of the operation of the movement at the higher velocity. By doing so, it is also possible to more reliably remove the foreign matter adhered to the liquid contact portion in some cases. Further, in the cleaning step, the substrate stage PST may be irregularly moved in the X direction and the Y direction with respect to the liquid immersion area AR2. Upon cleaning the measuring stage MST also, the measuring stage MST may be driven such that the velocity and/or the acceleration is/are increased as compared with those brought about during the exposure in the same manner as described above.

In the cleaning step, the dummy substrate CP shown in FIG. 5 may be loaded on the substrate stage PST shown in FIG. 1 (and FIG. 11), and the liquid immersion area AR2 may be formed on the dummy substrate CP by supplying the liquid 1 from the liquid supply mechanism 10; and the substrate stage PST may be driven in the Z direction as shown by an arrow HZ shown in FIG. 4, and the dummy substrate CP (substrate holder PH) may be vibrated in the Z direction with respect to the liquid immersion area AR2. In this case, a movement stroke ΔZ2 in the Z direction of the substrate stage PST in the cleaning step may be widened to be, for example, several times a movement stroke ΔZ1 in the Z direction of the substrate stage PST (substrate P) for the autofocus during the exposure performed just before the cleaning step. With this, it is also possible in some cases to more reliably remove the foreign matter adhered to the liquid contact portion. In the cleaning step, the movement velocity and/or the acceleration in the Z direction of the substrate stage PST may be increased to be greater than those brought about during the exposure instead of the widening of the movement stroke ΔZ2 as described above or in combination of the operation to widen the movement stroke. With this, it is also possible in some cases to more reliably remove the foreign matter adhered to the liquid contact portion. Further, a leveling operation, in which the angle of inclination of the substrate holder PH about the X axis and/or the Y axis is changed at a velocity higher than that brought about during the exposure, may be executed together with the operation to vibrate the substrate holder PH in the Z direction via the substrate stage PST or independently from the operation. Alternatively, the measuring stage MST may be arranged to be opposite to the optical element 2 instead of the substrate stage PST, and the measuring table MTB may be moved in the Z direction.

In order to switch and execute the operations as described above with ease, the control program of the controller CONT shown in FIGS. 1 and 11 may be previously provided with a first mode in which the ordinary exposure operation is performed, a second mode in which in the above-described cleaning step the substrate stage PST is driven in the X direction and the Y direction (directions perpendicular to the optical axis of the exposure light EL) so that the velocity and/or the acceleration is/are increased as compared with those brought about in the first mode, and a third mode in which in the above-described cleaning step the substrate stage PST is driven in the Z direction (direction parallel to the optical axis of the exposure light EL) so that the movement stroke and/or the velocity is/are increased as compared with those brought about in the first mode. By driving the exposure apparatus EX, EX' in the second mode or the third mode in the cleaning step described above, it is possible in some cases to more reliably remove the foreign matter adhered to the liquid contact portion.

As shown in FIG. 9A, it is also allowable that the substrate stage PST and the measuring table MTB are vibrated in antiphase in the Y direction in a state that the measuring table MTB of the measuring stage MST and the substrate stage PST are allowed to make contact with each other substantially in the X direction to form the liquid immersion area AR2 so that the boundary portion between the measuring table MTB and the substrate stage PST are included in the liquid immersion area AR2. That is, it is also allowable to alternately repeat an operation in which the substrate stage PST is moved in the −Y direction and the measuring table MTB is moved in the +Y direction as indicated by solid line arrows HP1, HM1 and an operation in which the substrate stage PST is moved in the +Y direction and the measuring table MTB is moved in the −Y direction as indicated by dotted line arrows HP2, HM2. With this, it is also possible to remove in some cases the foreign matter adhered to the liquid contact portion (including the upper surface of the measuring table MTB in this case) more reliably.

The cleaning step of each of the embodiments described above may be executed in order to perform the maintenance of the liquid supply mechanism 10 (10') and the liquid recovery mechanism 20 of the exposure apparatus EX, EX' shown in FIGS. 1 and 11. The maintenance may be performed, for example, periodically. Other than this, the liquid recovery section 21 shown in FIGS. 1 and 11 may be previously provided with a particle counter (not shown) which counts the number of particles (foreign matters) in the liquid recovered from the liquid immersion area AR2; and the maintenance may be performed when the counted values (amount of foreign matters) of the particle counter per unit flow rate of the recovered liquid exceeds a predetermined allowable level.

In the cleaning step for the maintenance, the liquid 1 is supplied to form the liquid immersion area AR2 on the substrate stage PST (for example, covered with the dummy substrate CP) or the measuring stage MST via the flow passage-forming member 30 from the liquid supply mechanism 10 (10') shown in FIGS. 1 and 11 in the same manner as in the cleaning step of each of the embodiments described above. The substrate stage PST or the measuring stage MST is vibrated or moved in this state in the X direction, the Y direction, and/or the Z direction. If necessary, the liquid 1 in the liquid immersion area AR2 is recovered by the liquid recovery mechanism 20 via the flow passage-forming member 30. By doing so, the foreign matter, adhering to at least a part of the liquid contact portion, is removed. Therefore, the foreign matter is decreased in the liquid immersion area AR2 in the exposure step to be performed thereafter, and it is possible to perform the exposure highly accurately.

Also in the cleaning step for the maintenance, as shown in FIGS. 4, 14A, and 14B, it is also allowable to increase at least one of the movement stroke, the velocity, and the acceleration of the substrate stage PST to be greater than those brought about during the exposure step performed just before the cleaning step for maintenance. This also holds equivalently in the case of the measuring stage MST. Further, as shown in FIG. 9A, the substrate stage PST and the measuring table MTB may be vibrated in antiphase in a state that the substrate stage PST and the measuring table MTB are allowed to substantially make contact with each other to form the liquid immersion area AR2 so that the boundary portion therebetween is included in the liquid immersion area AR2.

In the embodiments described above, the cleaning of the measuring stage MST is executed after executing the cleaning of the substrate stage PST. However, the cleaning of the measuring stage MST may be executed during the period in which the dummy substrate CP is placed on the substrate stage PST, and then the cleaning of the substrate stage PST may be executed.

It is also allowable that the cleaning of the substrate stage PST and the cleaning of the measuring stage MST are not performed sequentially or one by one. The cleaning of the substrate stage PST and the cleaning of the measuring stage MST may be executed, for example, in the state that the substrate stage PST and the measuring stage MST are allowed to make tight contact with each other (allowed to approach closely to each other) as shown in FIG. 8. In the respective embodiments described above, both of the substrate stage PST and the measuring stage MST are cleaned in one time of the cleaning step. However, it is also allowable that only any one of the stages is cleaned in one time of the cleaning step.

In the respective embodiments described above, the substrate stage PST (and/or the measuring stage MST) is moved to move the substrate stage PST (and/or the measuring stage MST) relative to the liquid immersion area AR2. However, it is allowable that the flow passage-forming member 30 is made movable, and the liquid immersion area AR2 is moved on the substrate stage PST (and/or the measuring stage MST) which is allowed to stand still. In the respective embodiments described above, the interferometer system (56A to 56C) is used to measure the respective pieces of position information about the mask stage RST, the substrate stage PST, and the measuring stage MST. However, there is no limitation to this. For example, it is also allowable to use an encoder system for detecting a scale (diffraction grating) provided on each of the stages. In this case, it is preferable that a hybrid system including both of the interferometer system and the encoder system is provided, and the measurement result of the encoder system is calibrated (subjected to the calibration) by using the measurement result of the interferometer system. The position control of the substrate stage may be performed by switchingly using the interferometer system and the encoder system or using both of the interferometer system and the encoder system.

In the respective embodiments described above, the substrate holder PH and the substrate stage PST may be formed as an integrated body. Alternatively, the substrate holder PH and the substrate stage PST may be constructed separately, and the substrate holder PH may be fixed to the substrate stage PST, for example, by the vacuum attraction. The present invention is also applicable to an exposure apparatus in which various measuring devices (measuring members) are provided on the substrate stage PST (exposure apparatus not provided with the measuring stage MST). Only a part or parts of various measuring devices may be provided on the measuring stage MST or the substrate stage PST, and the remaining part of the measuring devices may be provided at the outside or on any distinct member.

In the cleaning step of each of the embodiments described above, the cleaning liquid, which is supplied from the liquid supply mechanism 10, 10' (liquid supply section 11, 12), is recovered by the liquid recovery mechanism 20 (liquid recovery section 21) and the sucking device 50. Therefore, the foreign matter, which is removed together with the liquid 1 from the surfaces of the substrate stage PST and the measuring stage MST, can be prevented from remaining on any other place.

In the respective embodiments described above, water (pure or purified water) is used as the liquid 1 to be used for the liquid immersion method. However, it is also allowable to use any liquid other than water. For example, when the light source of the exposure light EL is the $F_2$ laser (wavelength: 157 nm), the liquid 1 may be, for example, fluorine-based fluids such as fluorine-based oil and perfluoropolyether (PFPE). Alternatively, other than the above, it is also possible to use, as the liquid 1, those (for example, cedar oil) which have the transmittance with respect to the exposure light EL, which have the refractive index as high as possible, and which are stable against the resist coated on the surface of the substrate P and the projection optical system PL. Those having refractive indexes higher than those of silica glass and calcium fluoride (refractive index of about 1.6 to 1.8) may be used as the liquid 1. Further, the optical element 2 may be formed of a material having a refractive index (for example, not less than 1.6) higher than those of silica glass and calcium fluoride.

Figure 17:
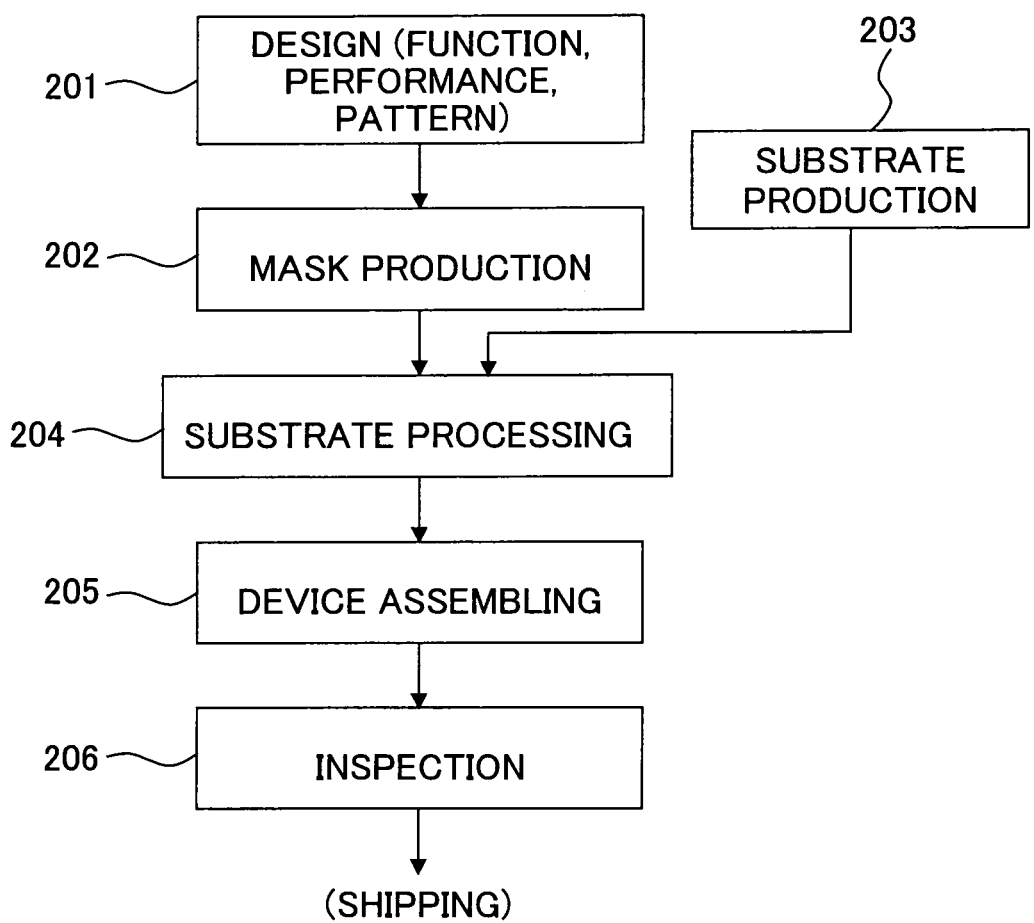
FIG. 17 is a flow chart of exemplary steps of producing a microdevice.

As shown in FIG. 17, the microdevice such as a semiconductor device is produced by performing a step 201 of designing the function and the performance of the microdevice; a step 202 of manufacturing a mask (reticle) based on the designing step; a step 203 of producing a substrate as a base material for the device; a substrate-processing step 204 including, for example, a step of exposing the substrate with the pattern of the mask by the exposure apparatus EX, EX' of the embodiment described above, a step of developing the exposed substrate, and a step of heating (curing) and etching the developed substrate; a step 205 of assembling the device (including processing processes such as a dicing step, a bonding step, and a packaging step); an inspection step 206; and the like.

As for the type of the exposure apparatus EX, EX', the present invention is not limited to the exposure apparatus, for the semiconductor device production, which exposes the substrate P with the semiconductor device pattern. The present invention is also widely applicable, for example, to an exposure apparatus for producing a liquid crystal display device or for producing a display as well as an exposure apparatus for producing, for example, a thin film magnetic head, a micromachine, MEMS, a DNA chip, an image pickup device (CCD), a reticle, or a mask.

The substrate P, which is usable in the respective embodiments described above, is not limited only to the semiconductor wafer for producing the semiconductor device. Those applicable include, for example, a glass substrate for the display device, a ceramic wafer for the thin film magnetic head, a master plate (synthetic silica glass, silicon wafer) for the mask or the reticle to be used for the exposure apparatus, a film member, etc. Further, the shape of the substrate P is not limited only to the circular shape, and may be any other shape including, for example, rectangular shapes. In the respective embodiments described above, the mask, on which the transferring pattern is formed, is used. However, instead of such a mask, it is also allowable to use an electronic mask for forming a transmissive pattern or a reflective pattern based on the electronic data of the pattern to be subjected to the exposure as disclosed, for example, in U.S. Pat. No. 6,778,257. The electronic mask is also referred to as "variable shaped mask" ("active mask", or "image generator"), and includes, for example, DMD (Digital Micro-mirror Device) as a kind of the no light-emitting image display device (spatial light modulator). DMD has a plurality of reflecting elements (micro-mirrors) which are driven based on a predetermined electronic data; and the plurality of reflecting elements are arranged in a two-dimensional matrix form on a surface of DMA, and are driven individually (element by element) to reflect and deflect the exposure light. Angles of the reflecting surfaces of the respective reflecting elements are adjusted. The operation of DMD may be controlled by the controller CONT. The controller CONT drives the reflecting elements of DMD based on the electronic data (pattern information) corresponding to a pattern to be formed on the substrate P, and makes the exposure light radiated by the illumination system IL to be patterned by the reflecting elements. The usage of DMD makes it unnecessary to perform the exchange operation for the mask and the alignment operation for the mask on the mask stage upon exchanging the pattern, as compared with a case that the exposure is performed by using the mask (reticle) formed with the pattern. Therefore, it is possible to perform the exposure operation more efficiently. In the case of the exposure apparatus using the electronic mask, it is enough only that the substrate is moved in the X axis direction and the Y axis direction by the substrate stage, without providing the mask stage. The exposure apparatus using DMD is disclosed, for example, in Japanese Patent Application Laid-open Nos. 8-313842 and 2004-304135 in addition to United States Patent described above. The disclosure of U.S. Pat. No. 6,778,257 is incorporated herein by reference within a range of permission of the domestic laws and ordinances of the designated state or the selected state.

As for the exposure apparatus EX, EX', the present invention is also applicable to a scanning type exposure apparatus (scanning stepper) based on the step-and-scan system for performing the scanning exposure with a pattern of the mask M by synchronously moving the mask M and the substrate P as well as a projection exposure apparatus (stepper) based on the step-and-repeat system for performing the full field exposure with a pattern of the mask M in a state that the mask M and the substrate P are allowed to stand still, while successively step-moving the substrate P. It is not necessarily indispensable that the exposure apparatus of the present invention and the exposure apparatus to which the exposure method and the maintenance method of the present invention are applied are provided with the projection optical system. It is enough that the exposure apparatus is provided with any optical member for guiding the exposure light from the light source to the substrate within a range in which the present invention can be carried out. It is also allowable that the illumination optical system and/or the light source is/are provided separately from the exposure apparatus. It is also possible to omit the mask stage and/or the substrate stage depending on the exposure system and the embodiment or aspect of the present invention as described above. The present invention is also applicable to an exposure apparatus of the multi-stage type provided with a plurality of substrate stages as disclosed, for example, in Japanese Patent Application Laid-open No. 10-163099, Japanese Patent Application Laid-open No. 10-214783 (corresponding to U.S. Pat. Nos. 6,341,007, 6,400,441, 6,549,269, and 6,590,634), Published Japanese Translation of PCT International Publication for Patent Application No. 2000-505958 (corresponding to U.S. Pat. No. 5,969,441), and U.S. Pat. No. 6,208,407. In this case, the cleaning is carried out each of for the plurality of substrate stages. The contents of the above-identified United States Patents are incorporated herein by reference within a range of permission of the domestic laws and ordinances of the designated state or the selected state in relation to the exposure apparatus of the multi-stage type.

In the case of the projection optical system of each of the embodiments described above, the optical path space, which is on the image plane side of the optical element arranged at the end portion, is filled with the liquid. However, it is also possible to adopt a projection optical system in which the optical path space on the mask side of the optical element arranged at the end portion is also filled with the liquid, as disclosed, for example, in International Publication No. 2004/019128. Further, the present invention is also applicable to an exposure apparatus of the liquid immersion type in which the liquid immersion area between the projection optical system and the substrate is held or retained by an air curtain arranged around the liquid immersion area. The present invention is also applicable to an exposure apparatus in which a line-and-space pattern is formed on the substrate P by forming interference fringes on the substrate P as disclosed, for example, in International Publication No. 2001/035168. Also in this case, the exposure light is radiated onto the substrate P through the liquid between the optical member and the substrate P.

In the respective embodiments described above, it is not necessarily indispensable that the liquid supply section and/or the liquid recovery section is/are provided on the exposure apparatus. For example, any equipment of the factory or the like in which the exposure apparatus is installed may be substitutively used. The structure required for the liquid immersion exposure is not limited to the structure as described above; and it is possible to use those described, for example, in European Patent Publication No. 1420298, International Publication Nos. 2004/055803 and 2004/057590, International Publication No. 2005/029559 (corresponding to United States Patent Publication No. 2006/0231206), International Publication No. 2004/086468 (corresponding to United States Patent Publication No. 2005/0280791), and Japanese Patent Application Laid-open No. 2004-289126 (corresponding to U.S. Pat. No. 6,952,253). The contents of, for example, the above-identified United States Patents and United States Patent Publications are incorporated herein by reference within a range of permission of the domestic laws and ordinances of the designated state or the selected state in relation to the liquid immersion mechanism of the liquid immersion exposure apparatus and any apparatus equipped thereto.

In the respective embodiments described above, it is also allowable to use, as the liquid 1 to be used for the liquid immersion method, any liquid having a refractive index with respect to the exposure light higher than that of water, for example, those having the refractive index of about 1.6 to 1.8. The liquid 1, which has the refractive index (for example, not less than 1.5) higher than that of pure or purified water, includes, for example, predetermined liquids having the C—H bond or the O—H bond such as isopropanol having a refractive index of about 1.50 and glycerol (glycerin) having a refractive index of about 1.61; predetermined liquids (organic solvents) such as hexane, heptane, and decane; decalin (decahydronaphthalene) having a refractive index of about 1.60; and the like. As for the liquid 1, it is also allowable to use those obtained by mixing arbitrary two or more liquids of the foregoing liquids, and it is also allowable to use those obtained by adding (mixing) at least one of the foregoing liquids to (with) pure water. Further, as for the liquid 1, it is also allowable to use those obtained by adding (mixing) base or acid such as $H^+$, $Cs^+$, $K^+$, $Cl^-$, $SO_4^{2-}$, and $PO_4^{2-}$ to (with) pure water; and it is also allowable to use those obtained by adding (mixing) fine particles of Al oxide or the like to (with) pure water. As for the liquid 1, it is preferable to use those which have a small coefficient of light absorption, which have a small temperature dependency, and which are stable against a photosensitive material (or, for example, a top coat film or an antireflection film) coated on the surface of the substrate P and/or the projection system PL. As for the liquid 1, it is also possible to use a supercritical fluid. As for the substrate P, it is possible to provide, for example, the top coat film which protects the photosensitive material and the base material from the liquid.

On the other hand, the optical element (terminal end or final optical element) 2 of the projection optical system PL may be formed of, for example, silica glass (silica) or any single crystal material of any fluorine compound such as barium fluoride, strontium fluoride, lithium fluoride, and sodium fluoride instead of calcium fluoride. Alternatively, the optical element (final optical element) 2 may be formed of a material having a refractive index (for example, not less than 1.6) higher than those of silica glass and calcium fluoride. Those usable as the material having the refractive index of not less than 1.6 include, for example, sapphire and germanium dioxide as disclosed, for example, in International Publication No. 2005/059617; and potassium chloride (refractive index: about 1.75) as disclosed in International Publication No. 2005/059618.

When the liquid immersion method is used, it is also appropriate that the optical path on the object plane side of the final optical element is also filled with the liquid, in addition to the optical path on the image plane side of the final optical element as disclosed, for example, in International Publication No. 2004/019128 (corresponding to United States Patent Application Publication No. 2005/0248856). Further, a thin film, which has the lyophilic or liquid-attractive property and/or the anti-dissolution function, may be formed on a part (including at least the contact surface making contact with the liquid) or all of the surface of the final optical element. The silica glass has a high affinity for the liquid, for which any dissolution-preventive film is not required as well. However, it is preferable for calcium fluoride to form at least the anti-dissolution film.

In the respective embodiments described above, the ArF excimer laser is used as the light source for the exposure light EL. However, it is also allowable to use a high harmonic wave-generating device which includes, for example, a solid laser light source such as a DFB semiconductor laser or a fiber laser, a light-amplifying section having a fiber amplifier or the like, and a wavelength-converting section; and which outputs a pulse light beam having a wavelength of 193 nm as disclosed, for example, in International Publication No. 1999/46835 (corresponding to U.S. Pat. No. 7,023,610). Further, in the respective embodiments described above, the projection area (exposure area) is rectangular. However, it is also allowable to adopt any other shape including, for example, circular arc-shaped, trapezoidal, parallelogramic, and rhombic shapes.

Further, the present invention is also applicable, for example, to an exposure apparatus in which patterns of two masks are combined on the substrate via the projection optical system, and one shot area on the substrate is subjected to the double exposure substantially simultaneously by one time of the scanning exposure as disclosed, for example, in Published Japanese Translation of PCT International Publication for Patent Application No. 2004-519850 (corresponding to U.S. Pat. No. 6,611,316). As described above, the present invention is not limited to the foregoing embodiments, and may be embodied in other various forms within a range without deviating from the gist or essential characteristics of the present invention.

As described above, the exposure apparatus EX, EX' according to the embodiment of the present invention is produced by assembling the various subsystems including the respective constitutive elements as defined in claims so that the predetermined mechanical accuracy, electric accuracy and optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which the temperature, the cleanness, etc. are managed.

As for various United States Patents and United States Patent Application Publications referred to in this specification, the contents thereof are incorporated herein by reference within a range of permission of the domestic laws and ordinances of the designated state or the selected state, in relation to those other than those having been specifically and explicitly incorporated herein by reference as well.

According to the exposure method and the method for producing the device of the present invention, the amount of the foreign matter in the liquid of the liquid immersion area is decreased, and hence the yield of the device to be produced is improved. Therefore, the present invention will remarkably contribute to the development of the precision mechanical equipment industry including the semiconductor industry of our country.

What is claimed is:

1. An exposure method for exposing a substrate, the exposure method comprising:
forming a liquid immersion area on the substrate held by a holding portion of a substrate stage to expose the substrate with an exposure light through an immersion liquid of the liquid immersion area; and
cleaning the substrate stage by moving the substrate stage relative to a liquid immersion area of a cleaning liquid during a period in which the substrate is not exposed,
wherein during the cleaning, the holding portion holds a dummy substrate having an upper surface portion and an edge portion which is more liquid-attractive than the upper surface portion.

2. The exposure method according to claim 1, wherein the cleaning liquid is the immersion liquid.

3. The exposure method according to claim 1, wherein the substrate stage has a flat surface which is arranged around the holding portion and which is substantially parallel to a surface of the substrate held by the holding portion; and
the substrate stage is moved relative to the liquid immersion area in a state that at least a part of the liquid immersion area is formed on the flat surface during the cleaning.

4. The exposure method according to claim 1, wherein the dummy substrate is flat plate-shaped.

5. The exposure method according to claim 1, wherein the upper surface portion of the dummy substrate is substantially parallel to a flat surface around the holding portion.

6. The exposure method according to claim 1, wherein the substrate stage is moved relative to the liquid immersion area so that at least a part of the liquid immersion area is moved substantially on only the dummy substrate.

7. The exposure method according to claim 1, wherein a plurality of liquid-attractive grooves are formed on the upper surface of the dummy substrate.

8. The exposure method according to claim 1, wherein the substrate stage is moved relative to the liquid immersion area during the cleaning so that at least a part of a movement range of the liquid immersion area on the substrate stage during the cleaning is different from a movement range of the liquid immersion area on the substrate stage during the exposure.

9. The exposure method according to claim 1, wherein the substrate stage is moved relative to the liquid immersion area of the cleaning liquid so that at least one of a velocity and an acceleration of the movement of substrate stage relative to the liquid immersion area in a direction perpendicular to an optical axis of the exposure light is greater than that during the exposure of the substrate.

10. The exposure method according to claim 1, wherein the substrate stage is moved relative to the liquid immersion area of the cleaning liquid so that at least one of a velocity and a stroke of the movement of substrate stage relative to the liquid immersion area in a direction parallel to an optical axis of the exposure light is greater than that during the exposure of the substrate.

11. The exposure method according to claim 1, further comprising forming the liquid immersion area of the cleaning liquid on a measuring stage which is movable independently from the substrate stage, and moving the measuring stage relative to the liquid immersion area so as to clean the measuring stage.

12. The exposure method according to claim 11, wherein the substrate stage and the measuring stage are allowed to approach closely to each other to form the liquid immersion area at a boundary portion between the substrate stage and the measuring stage and the substrate stage and the measuring stage are vibrated relative to each other in antiphase in a direction along a boundary line so as to clean the substrate stage and the measuring stage.

13. The exposure method according to claim 1, further comprising moving the substrate stage with respect to the liquid immersion area during the cleaning along a locus different from a locus of movement along which the substrate stage is moved when the substrate is exposed.

14. The exposure method according to claim 13, further comprising moving the substrate stage during the cleaning along a movement locus of the substrate stage along which the substrate stage is moved during alignment of the substrate or before or after the exposure of the substrate.

15. The exposure method according to claim 1, further comprising recovering the cleaning liquid of the liquid immersion area from above the substrate stage during the cleaning.

16. The exposure method according to claim 1, wherein the exposure light is radiated onto the substrate via an optical member and the immersion liquid; and
   an optical path space, for the exposure light, which is between the substrate and the optical member is filled with the immersion liquid to form the liquid immersion area locally to include an irradiation area of the exposure light on the substrate stage.

17. The exposure method according to claim 16, wherein a liquid immersion member is used to perform at least one of supply and recovery of the immersion liquid with respect to the liquid immersion area; and
   the liquid immersion member is also cleaned during the cleaning of the substrate stage.

18. The exposure method according to claim 1, wherein the cleaning liquid is supplied to form the liquid immersion area during the cleaning.

19. The exposure method according to claim 18, wherein the cleaning liquid is supplied to form the liquid immersion area by a liquid supply device which supplies the immersion liquid.

20. The exposure method according to claim 1, wherein the cleaning liquid is obtained by mixing a certain solvent with the immersion liquid.

21. The exposure method according to claim 1, wherein the cleaning liquid is recovered on a side of the substrate stage during the cleaning.

22. The exposure method according to claim 21, wherein the cleaning liquid, which inflows via a gap between the dummy substrate and a flat surface around the dummy substrate, is recovered in the substrate stage.

23. The exposure method according to claim 22, wherein the upper surface of the dummy substrate is substantially flush with the flat surface.

24. The exposure method according to claim 1, further comprising radiating the exposure light on a side of the substrate stage during the cleaning.

25. The exposure method according to claim 1, further comprising vibrating the substrate stage in a direction parallel to an optical axis of the exposure light during the cleaning.

26. The exposure method according to claim 1, further comprising ultrasonically vibrating the cleaning liquid of the liquid immersion area during the cleaning.

27. A method for producing a device, comprising:
   exposing a substrate by using the exposure method as defined in claim 1;
   developing the exposed substrate; and
   processing the developed substrate.

28. The exposure method according to claim 1, wherein the cleaning liquid includes water.

29. An exposure apparatus which exposes a substrate with an exposure light through an immersion liquid, the exposure apparatus comprising:
   a substrate stage having a holding portion which holds the substrate;
   a liquid immersion system having a supply port; and
   a controller which moves the substrate stage, the controller moving the substrate stage relative to a liquid immersion area of a cleaning liquid supplied from the supply port so as to clean the substrate stage during a period in which the substrate is not exposed,
   wherein during the cleaning,
      the holding portion holds a dummy substrate such that a gap is formed along an edge portion of the dummy substrate, the dummy substrate having an upper surface portion and the edge portion being more liquid-attractive than the upper surface portion,
      the controller moves the substrate stage relative to the liquid immersion area of the cleaning liquid, and
      the cleaning liquid, which has inflowed through the gap, is recovered from a recovery portion of the substrate stage.

30. The exposure apparatus according to claim 29, wherein the substrate stage has a flat surface which is arranged around the holding portion and which is substantially parallel to a surface of the substrate held by the holding portion; and
   the controller moves the substrate stage relative to the liquid immersion area of the cleaning liquid such that at least a part of the liquid immersion area is formed on the flat surface.

31. The exposure apparatus according to claim 30, wherein the upper surface portion of the dummy substrate is liquid-repellent and substantially flush with the flat surface.

32. The exposure apparatus according to claim 29, wherein the dummy substrate is flat plate-shaped.

33. The exposure apparatus according to claim 29, wherein at least the upper surface portion of the dummy substrate is liquid-repellent, and a plurality of liquid-attractive grooves are formed on the upper surface portion.

34. The exposure apparatus according to claim 29, wherein the controller has:
   a first mode in which the substrate is exposed; and
   a second mode in which the substrate stage is moved relative to the liquid immersion area of the cleaning liquid so that at least one of a velocity and an acceleration of the movement of substrate stage relative to the liquid immersion area in a direction perpendicular to an optical axis of the exposure light is greater than that in the first mode.

35. The exposure apparatus according to claim 34, wherein the controller has a third mode in which the substrate stage is moved relative to the liquid immersion area of the cleaning liquid so that at least one of a velocity and a stroke of the movement of substrate stage relative to the liquid immersion area of the cleaning liquid in a direction parallel to the optical axis of the exposure light is grater than that in the first mode.

36. The exposure apparatus according to claim 29, further comprising a measuring stage which is movable independently from the substrate stage;
   wherein the controller forms the liquid immersion area on the measuring stage during the period in which the substrate is not exposed, and moves the measuring stage relative to the liquid immersion area to execute cleaning of the measuring stage.

37. The exposure apparatus according to claim 36, wherein the controller allows the substrate stage and the measuring stage to approach closely to each other to form the liquid immersion area at a boundary portion between the substrate stage and the measuring stage and vibrates the substrate stage relative to the measuring stage in antiphase in a direction along a boundary line defining the boundary portion so as to clean the substrate stage and the measuring stage.

38. The exposure apparatus according to claim 29, wherein the liquid immersion system includes a liquid supply device which supplies the cleaning liquid, and a liquid recovery device which recovers the supplied cleaning liquid.

39. The exposure apparatus according to claim 38, wherein the liquid immersion system includes a liquid immersion member which performs at least one of the supply and the recovery of the cleaning liquid to form the liquid immersion area of the cleaning liquid; and the liquid immersion member is also cleaned during the cleaning of the substrate stage.

40. The exposure apparatus according to claim 29, wherein the liquid immersion system includes a first liquid supply device which supplies the immersion liquid, and a second liquid supply device which supplies the cleaning liquid containing a certain solvent; and the second liquid supply device supplies the cleaning liquid onto the substrate stage during the cleaning.

41. The exposure apparatus according to claim 40, wherein the second liquid supply device includes a mixing device which mixes the certain solvent into the immersion liquid supplied from the first liquid supply device; and the cleaning liquid is obtained by mixing the certain solvent into the immersion liquid.

42. The exposure apparatus according to claim 29, wherein the controller allows the exposure light to be emitted during the cleaning.

43. The exposure apparatus according to claim 29, wherein the controller vibrates the substrate stage in a direction parallel to the optical axis during the cleaning.

44. The exposure apparatus according to claim 29, further comprising a vibrator which ultrasonically vibrates the cleaning liquid of the liquid immersion area during the cleaning.

45. A method for producing a device, comprising:
exposing a substrate by using the exposure apparatus as defined in claim 29;
developing the exposed substrate; and
processing the developed substrate.

46. The exposure apparatus according to claim 29, wherein the cleaning liquid includes water.

47. The exposure apparatus according to claim 29, wherein during the cleaning, in order to promote the inflow of the cleaning liquid through the gap into a space under the gap, the controller moves the substrate stage such that the immersion area of the cleaning liquid is moved along the edge portion of the dummy substrate.

48. The exposure apparatus according to claim 29, wherein during the cleaning, in order to promote the inflow of the cleaning liquid through the gap into a space under the gap, the controller moves the substrate stage such that the immersion area of the cleaning liquid is moved annularly along the gap.

49. A maintenance method for an exposure apparatus which forms a liquid immersion area of an immersion liquid on a substrate held by a holding portion of a substrate stage and which exposes the substrate with an exposure light through the immersion liquid of the liquid immersion area, the maintenance method comprising:

arranging the substrate stage to be opposite to a liquid immersion member which performs at least one of supply and recovery of the immersion liquid to form the liquid immersion area; and moving the substrate stage relative to a liquid immersion area of a cleaning liquid to clean at least one of the liquid immersion member and the substrate stage during a period in which the substrate is not exposed, wherein during the cleaning, the holding portion holds a dummy substrate having an upper surface portion and an edge portion which is more liquid-attractive than the upper surface portion.

50. The maintenance method according to claim 49, wherein the substrate stage includes a flat surface which is arranged around the holding portion and which is substantially parallel to a surface of the substrate held by the holding portion; and during the cleaning, the substrate stage is moved relative to the liquid immersion area such that at least a part of the liquid immersion area is formed on the flat surface.

51. The maintenance method according to claim 49, wherein the dummy substrate is flat plate-shaped.

52. The maintenance method according to claim 49, wherein the substrate stage is moved relative to the liquid immersion area of the cleaning liquid during the cleaning so that at least one of a velocity and an acceleration of the movement of substrate stage relative to the liquid immersion area in a direction perpendicular to an optical axis of the exposure light is greater than that during the exposure of the substrate.

53. The maintenance method according to claim 49, wherein the substrate stage is moved relative to the liquid immersion area of the cleaning liquid during the cleaning so that at least one of a velocity and a stroke of the movement of substrate stage relative to the liquid immersion area in a direction parallel to an optical axis of the exposure light is greater than that during the exposure of the substrate.

54. The maintenance method according to claim 49, wherein the exposure apparatus comprises a measuring stage which is movable independently from the substrate stage; and the liquid immersion area of the cleaning liquid is formed on the measuring stage, and the measuring stage is moved relative to the liquid immersion area to clean the measuring stage.

55. The maintenance method according to claim 54, wherein the substrate stage and the measuring stage are allowed to approach closely to each other to form the liquid immersion area at a boundary portion between the substrate stage and the measuring stage and the substrate stage is vibrated relative to the measuring stage in antiphase in a direction provided along a boundary line so that the substrate stage and the measuring stage are cleaned.

56. The maintenance method according to claim 49, wherein the exposure apparatus comprises a liquid recovery device which recovers the cleaning liquid of the liquid immersion area during the cleaning.

57. The maintenance method according to claim 49, wherein the cleaning liquid is the immersion liquid.

58. The maintenance method according to claim 49, wherein the cleaning liquid is obtained by mixing a certain solvent into the immersion liquid.

59. The maintenance method according to claim 49, wherein the cleaning liquid includes water.

* * * * *